(12) United States Patent
Esterline

(10) Patent No.: US 9,092,726 B2
(45) Date of Patent: Jul. 28, 2015

(54) NEURAL NETWORK FREQUENCY CONTROL

(75) Inventor: John Esterline, Marysville, PA (US)

(73) Assignee: Greenray Industries, Inc., Mechanicsburg, PA (US)

(*) Notice: Subject to any disclaimer, the term of this patent is extended or adjusted under 35 U.S.C. 154(b) by 214 days.

(21) Appl. No.: 13/570,563

(22) Filed: Aug. 9, 2012

(65) Prior Publication Data
US 2013/0041859 A1 Feb. 14, 2013

Related U.S. Application Data

(60) Provisional application No. 61/650,408, filed on May 22, 2012, provisional application No. 61/522,599, filed on Aug. 11, 2011.

(51) Int. Cl.
| | |
|---|---|
| G06N 3/02 | (2006.01) |
| H03L 1/02 | (2006.01) |
| H03L 1/04 | (2006.01) |
| G06N 99/00 | (2010.01) |
| G06N 3/08 | (2006.01) |

(52) U.S. Cl.
CPC *G06N 3/02* (2013.01); *H03L 1/025* (2013.01); *H03L 1/026* (2013.01); *H03L 1/04* (2013.01); *G06N 3/084* (2013.01); *G06N 99/005* (2013.01)

(58) Field of Classification Search
None
See application file for complete search history.

(56) References Cited

U.S. PATENT DOCUMENTS

| | | | |
|---|---|---|---|
| 4,839,613 A | 6/1989 | Echols et al. | |
| 5,075,868 A | 12/1991 | Andes et al. | |
| 5,446,828 A * | 8/1995 | Woodall | 706/25 |
| 5,705,956 A | 1/1998 | Neely | |
| 6,031,883 A | 2/2000 | Sanderford, Jr. et al. | |
| 6,166,608 A | 12/2000 | Merriss et al. | |
| 6,362,700 B1 | 3/2002 | Fry | |
| 6,603,364 B2 | 8/2003 | Nemoto | |

(Continued)

FOREIGN PATENT DOCUMENTS

| | | |
|---|---|---|
| GB | 2 360 404 A | 9/2001 |
| WO | WO 2013/023068 A1 | 2/2013 |

OTHER PUBLICATIONS

Khalid, et al., Temperature Control of a Water Bath Process: A Comparative Study Between Neuro-control, a Self-tuning Adaptive control, a Generalised Predictive Control, and a Conventional Feedback Control Approach, Jurnal Teknologi, vol. 18, (Dec. 1991), pp. 13-33.*

(Continued)

*Primary Examiner* — Wilbert L Starks
(74) *Attorney, Agent, or Firm* — Knobbe, Martens, Olson & Bear, LLP

(57) ABSTRACT

Systems and methods for controlling frequency output of an electronic oscillator to compensate for effects of a parameter experienced by the oscillator incorporate artificial neural network processing functionality for generating correction signals. A neural network processing module includes one or more neurons which receive one or more inputs corresponding to a parameter of an electronic oscillator, such as temperature. Weights are calculated and applied to inputs to the neurons of the neural network as part of a training process, wherein the weights help shape the output of the neural network processing module. The neural network may include a linear summation module configured to provide an output signal that is at least partially based on outputs of the one or more neurons.

24 Claims, 38 Drawing Sheets

(56) References Cited

U.S. PATENT DOCUMENTS

| | | |
|---|---|---|
| 6,618,711 B1 | 9/2003 | Ananth |
| 6,636,121 B2 | 10/2003 | Barak et al. |
| 6,756,831 B2 | 6/2004 | Shi et al. |
| 7,365,609 B2 | 4/2008 | Waheed et al. |
| 7,764,133 B1 | 7/2010 | Nicholls |
| 2009/0278616 A1 | 11/2009 | Nicholls |
| 2014/0337261 A1 | 11/2014 | Esterline |

OTHER PUBLICATIONS

Gjelsvik et al.; Evaluation of Oven Controlled Crystal Oscillator Performance Under Non-Continuous Stressed Operating Conditions. 1995 IEEE International Frequency Control Symposium; 1995. pp. 20-32.

R.L. Schultz, Dynamic Neural Network Calibration of quartz Transducers; 2002, International Journal of Robust and Nonlinear Control, 2002. 12: 1053-1066.

Opie, et al; Operation of a Neural Network Controlled Crystal Oscillator; 1994 IEEE International Frequency Control Symposium. 0-7803-1945-1/94. pp. 600-603.

Hivert, et al.; Neural Networks Trends for Frequency Control: A Review; IEEE International Frerquency Control Symposium. 0-7803-2500-1/95. pp. 10-19.

Edmonson et al. ; SAW Injection Locked Oscillators: Dynamic Behaviour and Application to Neural Networks; Dept. of Electrical and Computer Engineering McMaster University, Hamilton, Ontario, Canada, L85 4l7, 1993. pp. 131-135.

Romariz et al., Tunable Vertical-Cavity Surface-Emitting Laser with Feedback to Implement a Pulsed Neural Model. 1 Principles and experimental demonstration, Jul. 20, 2007; vol. 46, No. 21, Applied Optics. pp. 4736-4745.

Hussain et al., Adaptive Linearizing Control with Neural-Network-Based Hybrid Models; Ind. Eng. Chem. Res. 2001, 40, pp. 5604-5620.

Roychaudhuri, C., et al. A High Performance 1A GHz Voltage controlled oscillator using Neural System Architecture, Analog Integrated Circuits and Signal Processing, vol. 66, No. 3, Dec. 3, 2010, pp. 459-465.

Esterline, John C., "Temperature Compensation of Crystal Oscillators using an Artificial Neural Network", Frequency Control Symposium, 2012 IEEE International, May 21, 2012, pp. 1-7.

Galluppi, et al., Real Time On-Chip Implementation of Dynamical Systems with Spiking Neurons, WCCI 2012 IEEE World Congress on Computational Intelligence, Jun. 10-15, 2012. pp. 1-8.

International Search Report and Written Opinion in corresponding PCT Application No. PCT/US2012/050164. dated Dec. 14, 2012.

U.S. Appl. No. 14/567,981, filed Dec. 11, 2014, Esterline et al.

* cited by examiner

NEURAL NETWORK FREQUENCY CONTROL

RELATED APPLICATIONS

This application claims priority from, U.S. Provisional Patent Application Nos. 61/522,599, filed Aug. 11, 2011, and 61/650,408, filed May 22, 2012, which are expressly incorporated by reference herein in their entirety and made a part of the present specification.

BACKGROUND

1. Field

This disclosure relates generally to frequency control, and more particularly to control of electronic oscillator output.

2. Description of Related Art

Neural networks can be found abundantly in nature. The brains of all animals including humans comprise vast neural networks. Biological neural networks comprise biological neurons that are chemically connected or functionally related in the peripheral nervous system or the central nervous system of certain living creatures. A single neuron may be connected to many other neurons and the total number of neurons and connections in a network, called synapses, may be extensive. Apart from electrical signaling, there are other forms of signaling that arise from neurotransmitter diffusion, which have an effect on electrical signaling. As such, neural networks are extremely complex. As we know from the human condition, neural networks are extremely efficient at learning and adapting to changing environments, and more proficient than computers at certain difficult tasks such as image recognition. As an example of the utilization of neural networks in nature, bats fly at high speed and use their neural network to process their ultrasonic emissions to map their environment, calculate pursuit algorithms, and find and capture prey without injuring themselves, among other things.

Artificial Neural Networks (ANN's), also referred to herein as neural networks (NN's), are mankind's attempt at replicating nature's elegant solution. An ANN is a mathematical model or computational model that is modeled after, or inspired by, the structure and functionality of biological neural networks. To date, currently implemented ANN's have not provided the efficiency or computational power of the human brain.

SUMMARY

For purposes of summarizing the disclosure, certain aspects, advantages and novel features have been described herein. It is to be understood that not necessarily all such advantages can be achieved in accordance with any particular embodiment disclosed herein. Thus, the features disclosed herein can be embodied or carried out in a manner that achieves or optimizes one advantage or group of advantages as taught herein without necessarily achieving other advantages as can be taught or suggested herein.

Certain embodiments disclosed herein provide a process of controlling frequency output of an electronic oscillator to compensate for effects of a parameter experienced by the oscillator. The process may include receiving test data from an electronic oscillator, the electronic oscillator being subject to a parameter, wherein the test data corresponds to outputs generated by the electronic oscillator while being subject to the parameter over a range of parameter values. Furthermore, the process may include calculating a plurality of weights based at least in part on the test data and receiving from the electronic oscillator one or more input signals corresponding to a current value of the parameter. The one or more input signals may be provided to a neural network processing module including one or more processors. In addition, the plurality of weights may be provided to the neural network processing module.

The process may include using the neural network processing module to calculate a neural network output signal based at least in part on the one or more input signals and the plurality of weights and determining a correction voltage based at least in part on the neural network output signal. The correction voltage may, for example, be provided to the electronic oscillator, thereby at least partially controlling the frequency of the electronic oscillator. In certain embodiments, calculating a plurality of weights is performed prior to receiving one or more input signals.

The process may include generating an intelligent seed value, wherein calculating the plurality of weights is based at least in part on the seed value. Calculating the neural network output signal may include providing the input signals and the weights to a plurality of artificial neuron modules of the neural network processing module, wherein at least one of the weights is provided to each of the plurality of artificial neuron modules. The process may further include providing a neuron output from each of the plurality of neuron modules to a linear summer module, wherein the neural network output signal is based at least in part on an output of the linear summer module. A bias input may be provided to the linear summer for shifting the output of the linear summer up or down. In certain embodiments, each of the plurality of artificial neuron modules utilizes at least one of the weights and each of the input signals as variables of a non-linear activation function, wherein each of the plurality of artificial neuron modules provides an output that is based at least in part on a solution of the non-linear activation function. The activation function may advantageously be continuous and differentiable, such as a sigmoid function.

Certain embodiments provide a system for controlling frequency output of an electronic oscillator. The system may include a first input signal corresponding to a first parameter of an electronic oscillator and a neural network processing module operatively coupled to the first input signal, the neural network processing module including a plurality of artificial neuron modules, wherein each of the plurality of artificial neuron modules receives the first input signal and one of one or more pre-calculated weights, and provides a first output signal based at least in part on the first input signal and the one of the one or more pre-calculated weights. The pre-calculated weights may be derived at least in part from test data that corresponds to outputs generated by the electronic oscillator while experiencing a range of values of the first parameter. Furthermore, the neural network processing module may be configured to provide a second output signal to the electronic oscillator to thereby at least partially control frequency output of the electronic oscillator.

The second output may not be based on a real-time oscillating signal output of the electronic oscillator. The parameter may be related to a temperature of at least a portion of the electronic oscillator. In certain embodiments, the system further includes a second input signal corresponding to a second parameter, wherein each of the plurality of artificial neuron modules receives the second input signal, the first output signal being based in part on the second input signal. The system may further include a third input signal corresponding to a third parameter, wherein each of the artificial neuron modules receives the third input signal, the first output signal being based in part on the third input signal. The neural network processing module may be configured to generate a second output signal and provide the second output signal to a voltage-conversion module configured to convert the second output signal into a correction voltage, and provide the correction voltage to the electronic oscillator.

Certain embodiments disclosed herein provide a system for providing a correction signal to at least partially compensate for effects of a parameter of an electronic device. The system may include a first neural network processing module including one or more processors, the processing module configured to receive a first input signal corresponding to a parameter. The first neural network processing module may include a plurality of artificial neuron modules, wherein each of the plurality of artificial neuron modules receives one of one or more pre-calculated weights, and wherein the first neural network processing module is configured to provide a correction signal based at least in part on the first input signal and the one or more pre-calculated weights.

The neural network processing module may be configured to provide the correction signal to an electronic oscillator, the parameter being associated with the electronic oscillator. The first input signal may correspond to a temperature of at least a portion of the electronic oscillator. The neural network processing module may be further configured to receive a second input signal, the second input signal relating to an age of the electronic oscillator.

In certain embodiments, the system includes a memory module, an analog-to-digital converter, a digital-to-analog converter, and a low-pass filter. The first input signal may be provided by a motion sensor, such as, for example, an accelerometer. Alternatively, the first input signal may be provided by a pressure sensor. The first parameter may be hysteresis effects experienced by an electronic oscillator. The system may further include a second neural network processing module configured to receive the first input signal and provide a second output signal. The second output signal may be configured to at least partially control a heater device associated with the electronic oscillator.

Some embodiments disclosed herein provide a system for controlling frequency output of an electronic oscillator. The system may include an electronic signal input indicative of a parameter of an electronic oscillator and a neural network processing module operatively coupled to the electronic signal input. Furthermore, the neural network processing module may include a plurality of artificial neuron modules, wherein each of the plurality of artificial neuron modules receives at least one input signal, multiplies the at least one input signal by a pre-calculated weight, and provides a first output signal based, at least in part, on the electronic signal input indicative of a parameter of the electronic oscillator. The neural network processing module may produce a second output signal, and provide the second output signal to a voltage conversion module configured to convert the second output signal into a correction voltage, and provide the correction voltage to the electronic oscillator.

In some embodiments, a process of controlling the frequency of an electronic oscillator can include receiving data indicative of an output of the electronic oscillator over a range of temperatures; calculating a plurality of weights based, at least in part, on the data; receiving one or more input signals indicative of a parameter of the electronic oscillator; providing the one or more input signals to a neural network processing module; providing the weights to the neural network processing module; calculating a neural network output signal based, at least in part, on the one or more first signals and the plurality of weights; and using the neural network output signal to provide a correction voltage to the electronic oscillator to control the frequency of the electronic oscillator.

Some embodiments provide an electronic oscillator assembly including an electronic oscillator having a first output including an AC waveform and a second output providing a signal indicative of a parameter of the oscillator, wherein the oscillator is configured to receive a correction voltage signal. The system may further include a neural network processor configured to receive the second output and produce a third output based, at least in part, on the second output and a plurality of weights. The system may further include a voltage converter operatively connected to the oscillator and the neural network processor and configured to convert the third output into the correction voltage signal.

Some embodiments provide a system for adjusting a frequency of an electronic oscillator, wherein the system provides a neural network processor operative to receive an electronic temperature signal indicative of a temperature of the electronic oscillator. The neural network may be further operative to process the temperature signal by providing the temperature signal to a plurality of artificial neuron modules, wherein each of the artificial neuron modules produces an output signal by operating on the temperature signal using a substantially sigmoid-shaped activation function, wherein each of the sigmoid-shaped activation functions used by the plurality of artificial neuron modules is pre-calculated. The neural network may be further operative to provide the output signals produced by each of the plurality of artificial neuron modules to a linear summation module configured to produce an output based, at least in part, on the output signals produced by the plurality of artificial neuron modules. In some embodiments, the system includes a voltage conversion module configured to convert the output signal produced by the linear summation module into a correction voltage, and provide the correction voltage to the electronic oscillator.

BRIEF DESCRIPTION OF THE DRAWINGS

Various embodiments are depicted in the accompanying drawings for illustrative purposes, and do not limit the scope of the inventions. In addition, various features of different disclosed embodiments can be combined to form additional embodiments, which are part of this disclosure.

DETAILED DESCRIPTION

Figure 1:
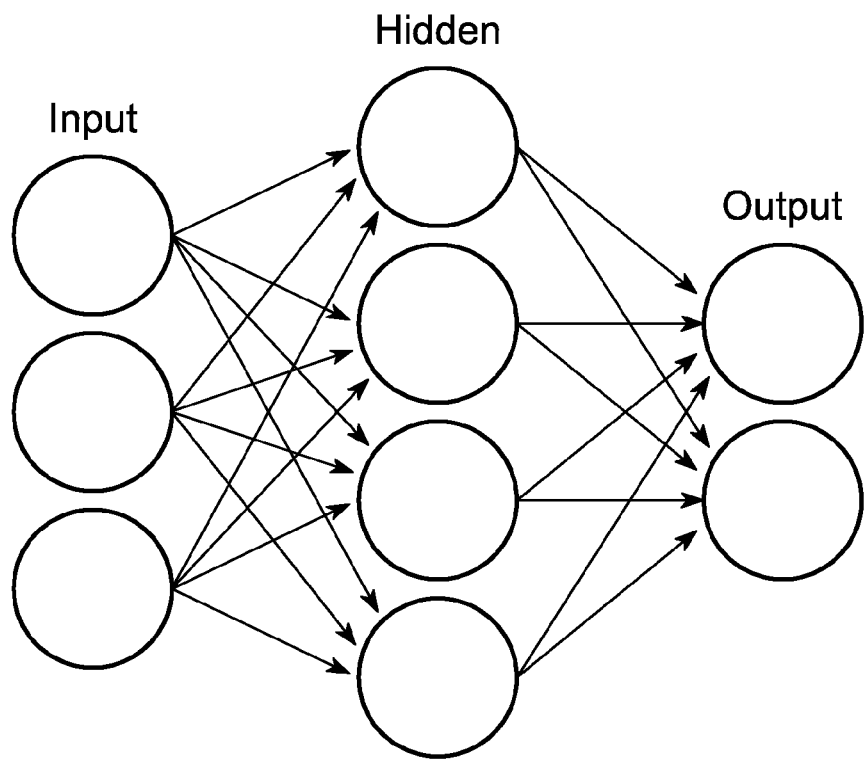
FIG. 1 is a schematic diagram of an embodiment of a neural network.

Certain embodiments of neural networks are suitable for function approximation, or curve fitting applications, and for application in the domain of frequency control. For example, an artificial neural network (referred to herein as "ANN" or "NN") may be used in the control of an electronic oscillator, or other frequency standard device. In some embodiments, an ANN is utilized in the correction of crystal oscillators. Frequency standard devices, such as electronic oscillators, are often subject to certain short-term instabilities, which may affect the performance of the system. Such instabilities can be caused by, among other things, temperature fluctuations, vibration, noise due to active and passive circuit components, fluctuations at resonator interfaces, magnetic field, trim effect, pressure, warm-up of the device, thermal distribution due to physical orientations of the device, aging, or other causes. Compensation for one or more of these parameters may be achieved through the design of an appropriately configured ANN. Furthermore, the principles disclosed herein may be applicable to areas beyond frequency control, and discussion herein in the context of frequency control is not limiting on the scope of this disclosure.

Although certain embodiments and examples are disclosed below, inventive subject matter extends beyond the specifically disclosed embodiments to other alternative embodiments and/or uses and to modifications and equivalents thereof. Thus, the scope of the invention is not limited by any of the particular embodiments described below. For example, in any method or process disclosed herein, the acts or operations of the method or process may be performed in any suitable sequence and are not necessarily limited to any particular disclosed sequence. Various operations may be described as multiple discrete operations in turn, in a manner that may be helpful in understanding certain embodiments; however, the order of description should not be construed to imply that these operations are order dependent. Additionally, the structures, systems, and/or devices described herein may be embodied as integrated components or as separate components. For purposes of comparing various embodiments, certain aspects and advantages of these embodiments are described. Not necessarily all such aspects or advantages are achieved by any particular embodiment. Thus, for example, various embodiments may be carried out in a manner that achieves or optimizes one advantage or group of advantages as taught herein without necessarily achieving other aspects or advantages as may also be taught or suggested herein.

Conditional language used herein, such as, among others, "can," "might," "may," "e.g.," and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment. The terms "comprising," "including," "having," and the like are synonymous and are used inclusively, in an open-ended fashion, and do not exclude additional elements, features, acts, operations, and so forth. Also, the term "or" is used in its inclusive sense (and not in its exclusive sense) so that when used, for example, to connect a list of elements, the term "or" means one, some, or all of the elements in the list.

Some embodiments include neural networks with interconnected groups of artificial neurons, referred to herein as neurons, and may provide functionality to process often complex information. Additional information about neural networks may be found in "Neural Networks: A Comprehensive Foundation." Simon Haykin, (2d ed., 1998). The specific connection architecture used helps to define functionality of a particular neural network. Neurons within a neural network are often organized into layers, as depicted in FIG. 1. While the model illustrated in FIG. 1 consists of nine neurons organized into three layers (organized by vertically arranged columns of neurons), ANN's may comprise any desirable number and/or arrangement of neurons, including any number of layers. The embodiment depicted in FIG. 1 comprises an input layer. The input layer may not include full neurons, but rather may include values in a data record, for example, that constitute inputs to the next layer of neurons. The activity of input neurons may represent raw information that is fed into the neural network.

Neural Network Structure

In some embodiments, an ANN may include one or more "hidden" layers. As shown in FIG. 1, the second layer may be considered a hidden layer in some embodiments. Unlike the input and output layers, the hidden layer may not be connected externally. A hidden layer may be used to recode, or provide a representation for, the inputs provided by the input layer. The activity of each hidden unit, or neuron, may be determined by the activities of the input neurons and the weights applied to the connections between the input and hidden neurons. In some embodiments, there are multiple hidden layers. Some embodiments do not include any hidden layers. Various other layers may be included in place of, or in addition to, one or more hidden layers. For example, an ANN may include a linear summer layer, which provides as output the sum of the inputs to the layer, possibly offset or modified in some way.

In the system of FIG. 1, the far-right layer is an output layer. A single sweep through the network from left to right results in the assignment of a value to each output node. The term "layer" is used herein according to its broad and ordinary meaning. For the purpose of description, "layer" may be used to refer to any stage of a neural network, including input and/or output stages, or may refer only to internal or hidden stages. The system depicted in FIG. 1 represents a feedforward system. "Feedforward" may refer to systems where connections between neurons do not form cycles or loops; information moves in one direction, from the input nodes, through any inner/hidden nodes, and to the output nodes. However, the principles described herein may be applicable to any suitable network configuration, such as a recurrent neural network.

Figure 2:
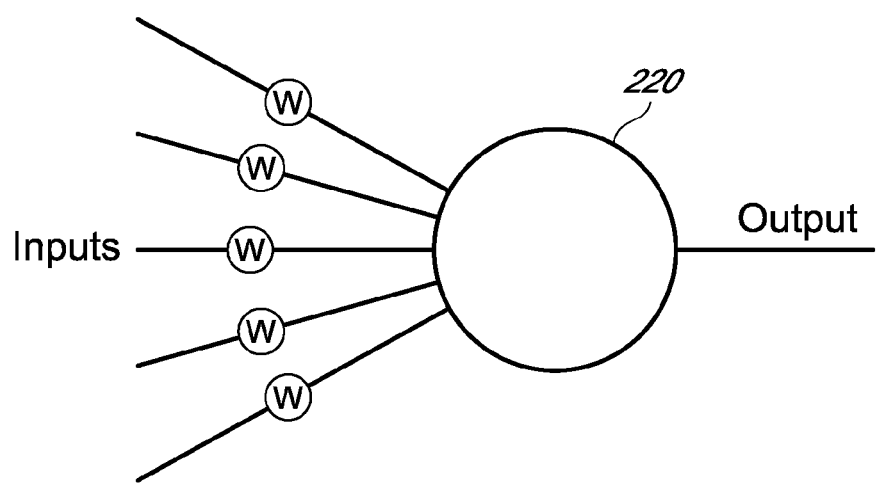
FIG. 2 is a schematic diagram of an embodiment of a neuron.

The individual neurons that make up a neural network can be based on any number of models. At a high level, neurons often take on the basic configuration depicted in FIG. 2. As illustrated in FIG. 2, a number of inputs, each of which is associated with a weight, 'w,' are fed into a processing module 220 which uses the inputs to calculate a single output. In some embodiments, a neuron may calculate, at least in part, an output by summing its inputs, or by summing inputs multiplied by one or more weights. In some embodiments, weights are floating point numbers that can be dynamically adjusted.

Activation Functions

Figure 3A:
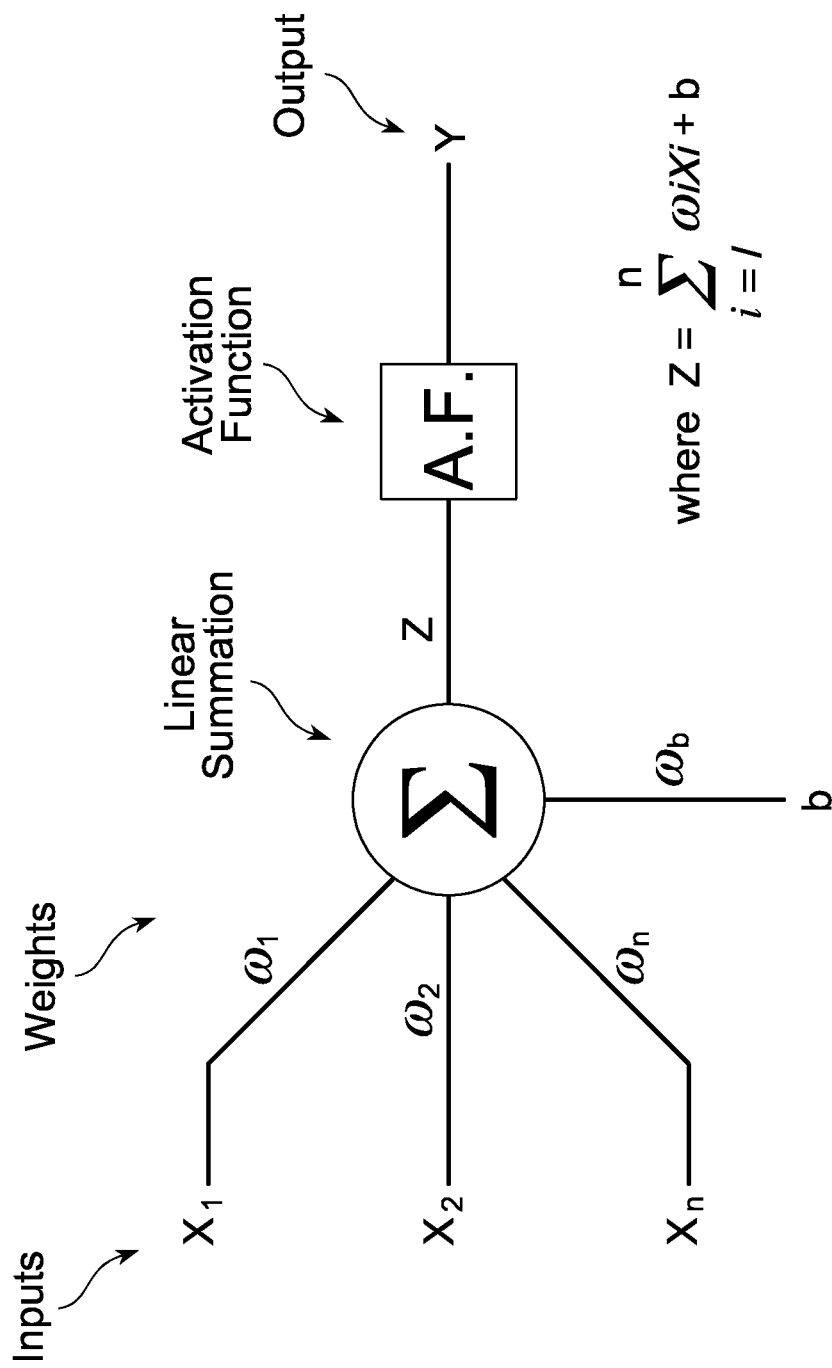
FIG. 3A is a schematic diagram of an embodiment of a neuron.

The processing module 220, which acts as a logical operator, is often referred to as a decision, or activation, function. FIG. 3A provides a more detailed diagram of an embodiment of a neuron model that may be used in frequency control or other applications. In some embodiments, the purpose of the activation function is to limit the amplitude of the output to some finite value. The model depicted in FIG. 3A is referred to as a perceptron model. As is shown in FIG. 3A, input vectors are scaled with individual synaptic weights $\omega_1$ through $\omega_n$, and fed into a linear summation module. The inputs are linearly summed together along with a bias term, 'b'. In FIG. 3A, the resulting linear sum is denoted as 'z'. The linear sum is then fed through an activation function to produce an output 'y.'

An activation function can have any desirable design. Many practical activation functions exist, and different types of issues/problems may call for solutions based on different activation functions. Table A below provides a list of commonly-used activation functions. However, the list of Table A is not comprehensive, and other activation functions not listed may be practical or desirable, depending on characteristics of the relevant system. For example, a system could incorporate one or more polynomial activation functions, such as first, second, third, fourth, fifth or higher-order polynomial activation functions. Furthermore, a system may incorporate a combination of different types of activation functions.

TABLE A

| Activation Function | Output | Equation |
| --- | --- | --- |
| Uni-Polar Binary | either a 0 or 1 output | $y = \begin{cases} 1 \text{ if } z \geq 0 \\ 0 \text{ if } z < 0 \end{cases}$ |
| Bi-Polar Binary | either a −1 or 1 output | $y = \begin{cases} 1 \text{ if } z \geq 0 \\ -1 \text{ if } z < 0 \end{cases}$ |
| Linear | a linear scale of the summation applied | $y = w_1 z$ where $w_1$ is the gain of the linear activation function |
| Uni-Polar Sigmoid | between 0 and 1 that follows the sigmoid shape factor | $y = \dfrac{1}{1 + e^{-a(z)}}$ the output is continuous and differentiable |
| Bi-Polar Sigmoid | between −1 and 1 that follows the sigmoid shape factor | $y = \dfrac{2}{1 + e^{-a(z)}} - 1$ the output is continuous and differentiable |

Frequency control using ANN techniques, such as ANN correction of crystal oscillators, may be suitable for a curve fitting application. For example, ANN applications may provide frequency correction for AT-cut crystal oscillators, such as AT-cut strip crystals manufactured by Statek Corporation, Orange, Calif. As may be known by those having ordinary skill in the art, approximation theory states that any signal can be constructed from a sum of any other signal. A special case of approximation theory provides that any signal can be broken up into a sum of sine and cosine signals. In view of approximation theory, neuron output signals may be summed together to fit, or approximate, a desired signal, such as a frequency curve. However, certain activation functions may be better suited than others for fitting or approximating a frequency curve.

In some embodiments, a linear activation function is used for fitting a frequency curve. However, as a linear activation function provides a linear output signal, it may be difficult to fit a non-linear frequency curve using such an activation function. In some embodiments, an ANN utilizing a linear activation function is used in combination with one or more other, possibly less complex, controllers, such as an analog circuit or other controller. The combined usage may allow for closer approximation of a frequency curve.

Figure 9A:
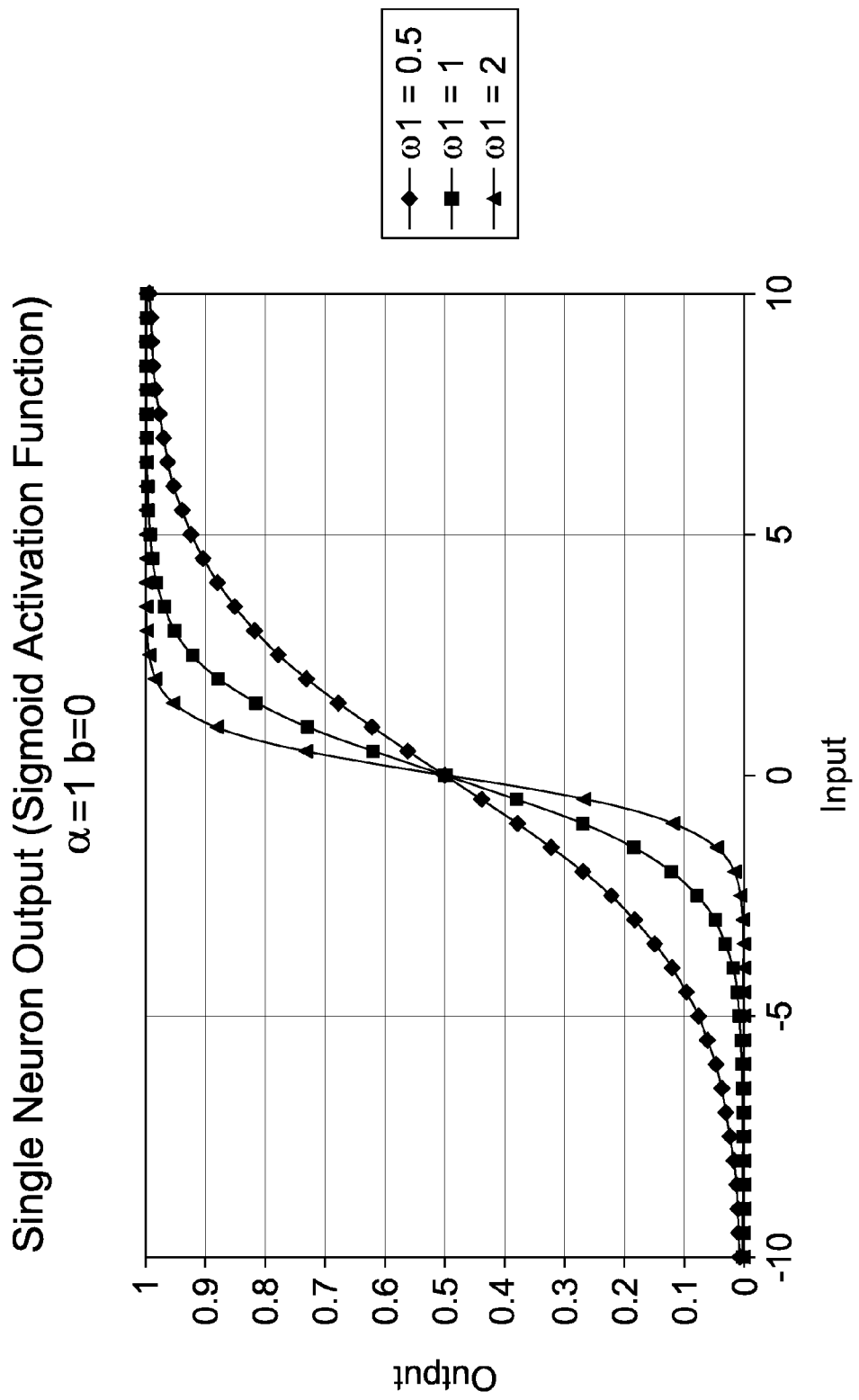
FIG. 9A is a graph of embodiments of a sigmoid curve.
Figure 9B:
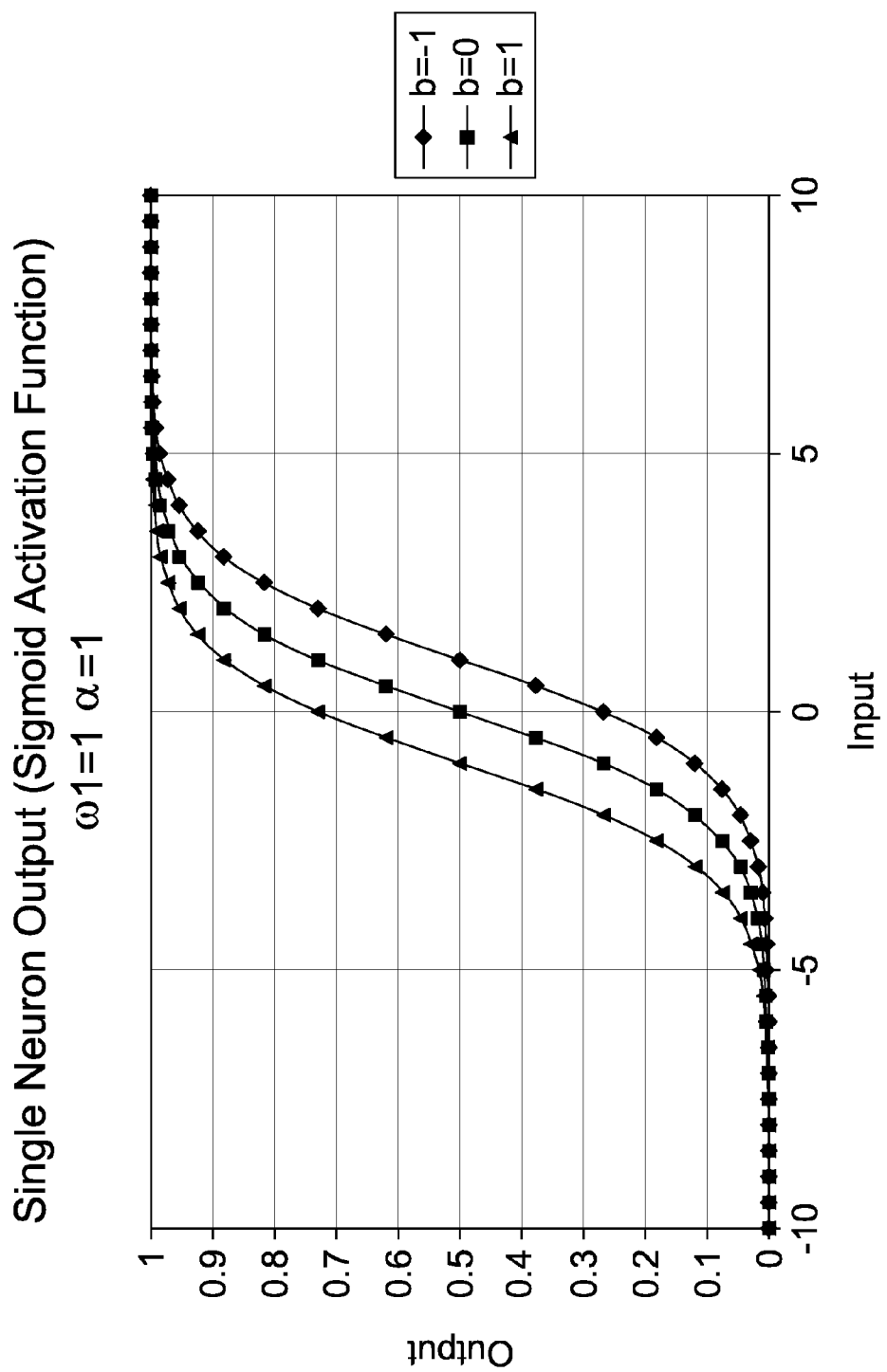
FIG. 9B is a graph of embodiments of a sigmoid curve.
Figure 9C:
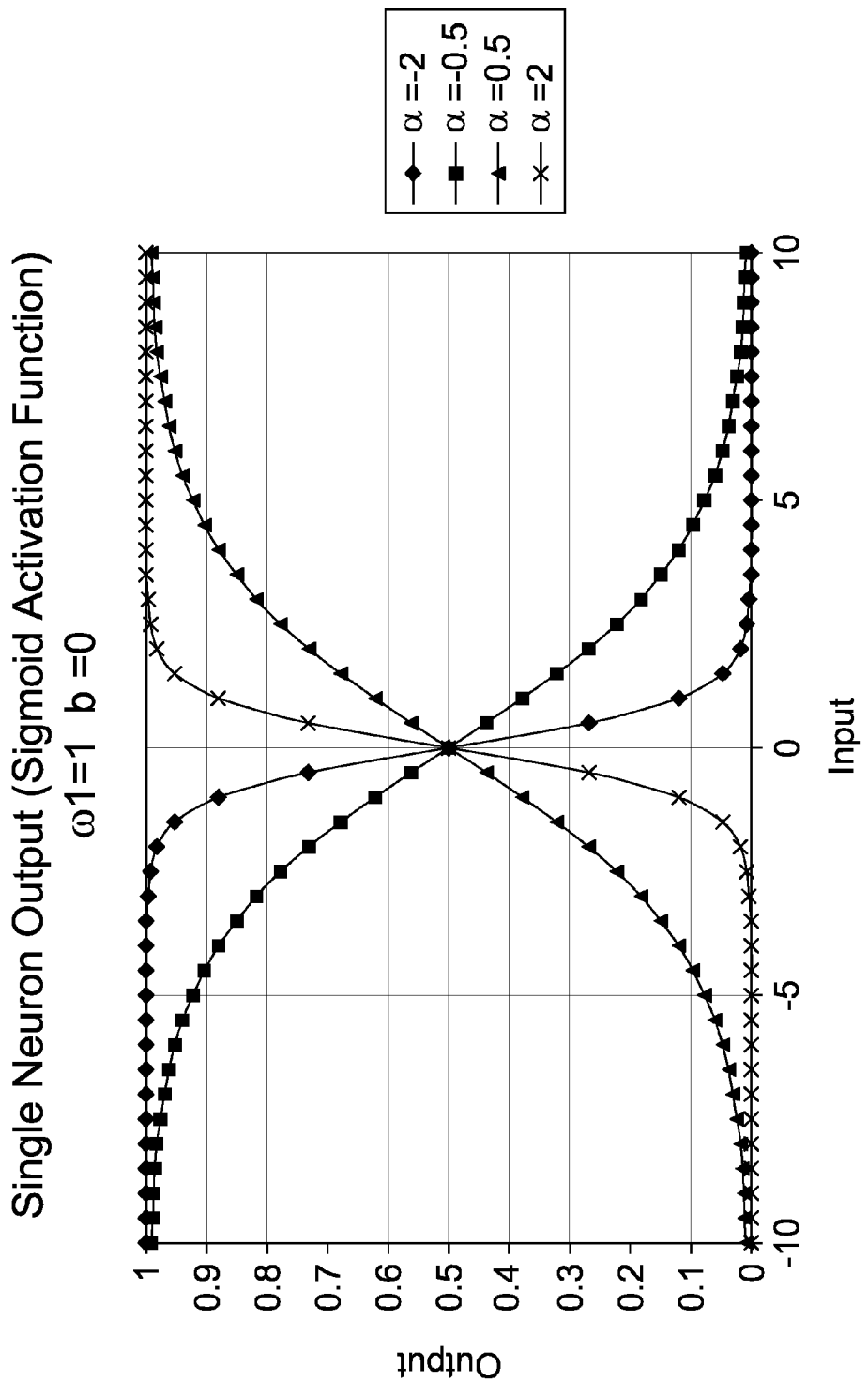
FIG. 9C is a graph of embodiments of a sigmoid curve.

In certain ANN embodiments designed for frequency control, it may be desirable to use a uni-polar sigmoid activation function. However, it is contemplated that any of the above-listed activation functions, or any other suitable activation function, may be used in frequency control applications. As shown in FIGS. 9A-9C, a sigmoid activation function, unlike linear or binary activation functions, includes beveled shape at each end. The beveled shape of the sigmoid function may allow for smoother curve fitting with fewer elements.

FIG. 3A illustrates a schematic diagram of an embodiment of a neuron. As shown in FIG. 3A, in some embodiments, an input vector including inputs $X_1$ through $X_n$ is multiplied by the individual synaptic weights $\omega_1$ through $\omega_n$, respectively. An additional bias signal, b, is also provided to the linear summation module. In some embodiments, the bias b has one or more of its own weights $\omega_b$. These products are summed together before being provided to the activation function. Equations (1) and (2) show the neuron in mathematical terms.

$$z_k = \left(\sum_{i=1}^{n} \omega_{ki} x_i\right) + \omega_{0b} b_x \text{ and} \tag{1}$$

$$y_k = \emptyset(z_k) \tag{2}$$

Figure 3B:
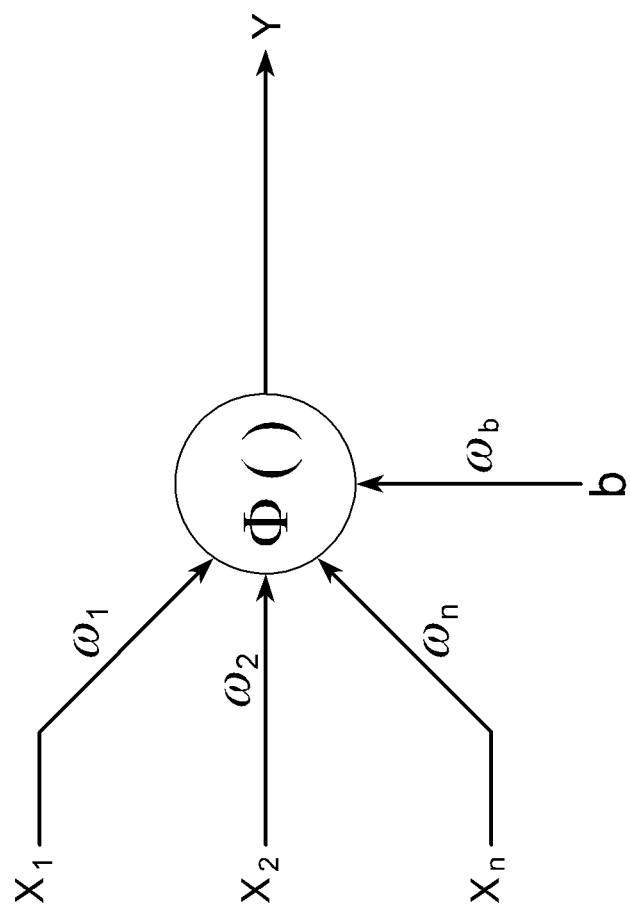
FIG. 3B is a schematic diagram of an embodiment of a neuron.

For simplicity, the diagram of FIG. 3A may be condensed so that the summation and the activation function are both contained in a single module (i.e., neuron bubble) as shown in FIG. 3B. Furthermore, while the embodiment of FIG. 3A shows the linear summer module positioned in the data path before the activation function, such functional modules may be configured in any suitable logical or physical order.

With respect to uni-polar sigmoid activation functions, the output value of the function may range from "0" to "1." Therefore, it may be desirable for a data set to be modeled to output values between "0" and "1" so that the ANN can properly fit the data. The weights may be initialized with random numbers. Alternatively, based on an understanding of sigmoid functions, starting values may be selected that pre-shape the individual sigmoid functions so that they are at least somewhat "close" to where they need to be, making the training of the network potentially easier. These concepts are discussed in greater detail below.

Figure 4:
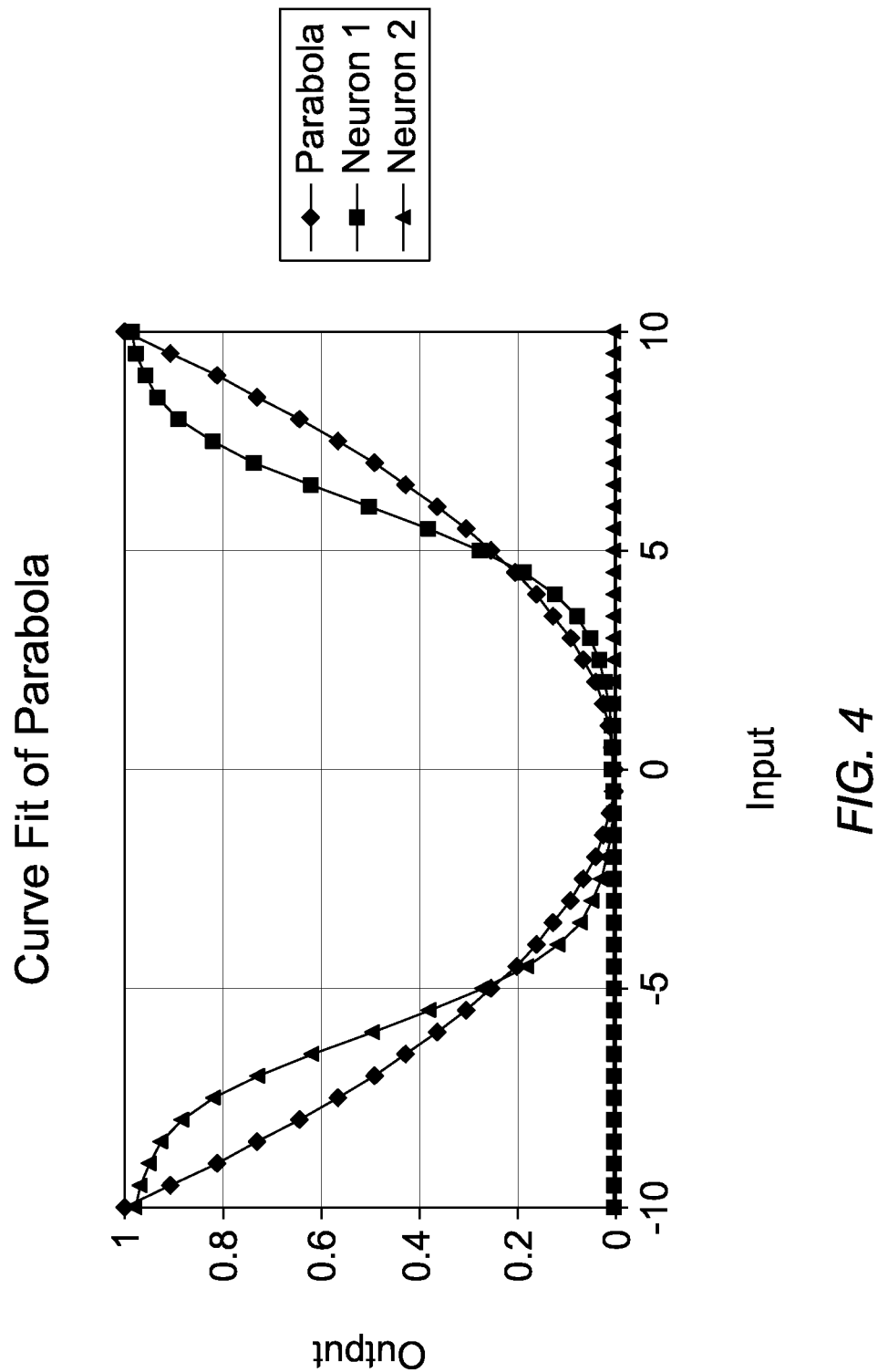
FIG. 4 is a graph of an embodiment of a neuron response with preselected initial weights.

Intelligent selection of starting values may be useful since gradient reduction methods may be prone to getting stuck in local minima. For example, if one would like to fit a parabola ($y=x^2$) using the ANN structure described below with reference to FIG. 7 (e.g., two neurons in the input layer), the initial values could be intelligently chosen, as shown in Table B. Table B provides neuron values with preselected initial weights. This may shift the neurons $y_1$ and $y_2$ left and right, producing the individual responses shown in FIG. 4.

TABLE B

| Variable | $y_1$ | $y_2$ | $Y_{out}$ |
|---|---|---|---|
| α | 1 | −1 | 1 |
| ω | 1 | 1 | 1 |
| b | −6 | 6 | 0 |

Figure 5:
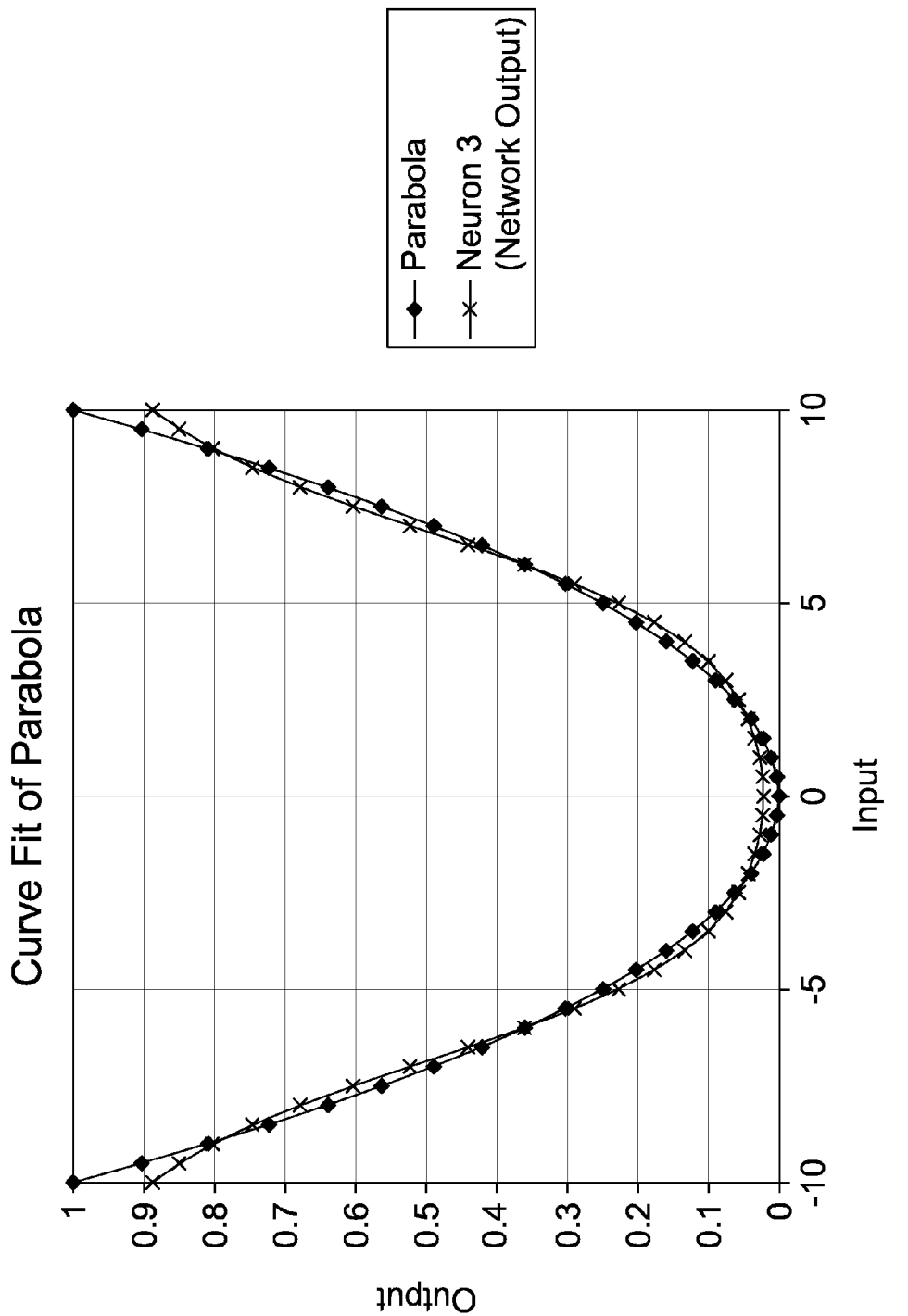
FIG. 5 is a graph of an embodiment of a curve fit of a parabola.

With these starting values, the method of least squares may obtain a solution for the network output as shown in FIG. 5, wherein the outputs of Neuron 1 and Neuron 2 are combined to approximate the shape of the parabola. The values for the relevant network weights are provided below in Table C.

TABLE C

| Variable | $y_1$ | $Y_2$ | $Y_{out}$ |
|---|---|---|---|
| α | 0.756 | −0.756 | 1 |
| ω | 0.871 | 0.871 | 1 |
| b | −5.979 | 5.979 | 0 |

The above example illustrates that, in some embodiments, an ANN may be used to approximate more complex functions than its individual neurons can themselves imitate.

Figure 7:
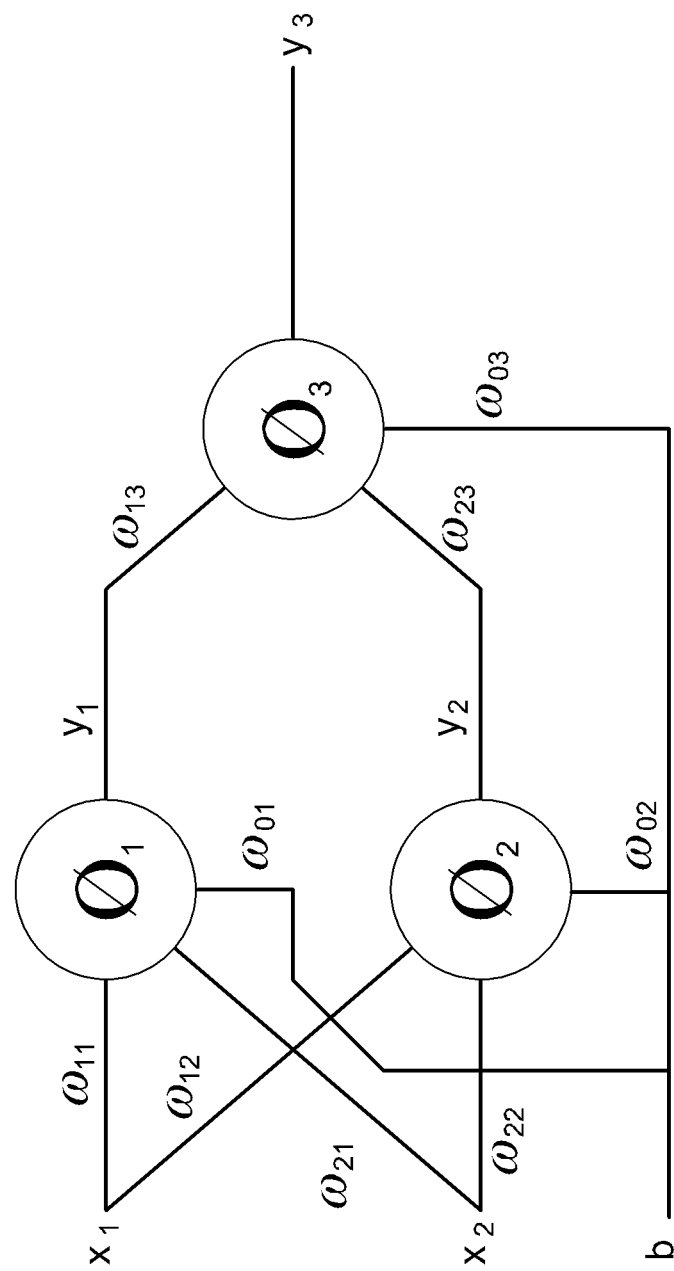
FIG. 7 is a schematic diagram of an embodiment of a neural network.

While the computational power of a single neuron may be insufficient to function as an accurate curve-fitting operator in certain circumstances, as the number of neurons increases, the computational power of the system may also increase. The computational power of the system may be at least partially governed by the connectivity between the neurons. In an embodiment comprising a single neuron with two inputs, $x_1$ and $x_2$, and a bias, b, the solution may include the calculation of three distinct weights. However, as illustrated in FIG. 7, if another neuron, $\emptyset_2$, were to be added to the two-input system, a third neuron, $\emptyset_3$, may also be necessary to tie the two solutions (y1, y2) together into one output (y3). Such a configuration may require nine coefficients to be solved. As additional neurons are added to the system, the number of weights may increase significantly, thereby increasing the computational complexity of the system. As shown in FIG. 7, the output layer has inputs y1, y2 that are the outputs of the neurons from the previous layer. This structure can produce an output $y_3$ that is more complex than any of the individual neurons themselves can create. While, as discussed above, an ANN may include hidden layers, for the purposes of curve fitting, in may not be necessary to include a hidden layer.

Neural Network Training

Once the connection architecture and activation function of an ANN have been chosen, in some embodiments, the input weights must be "trained" so that the output classifies the input signal to the desired output. For example, the network may be trained using supervised learning or unsupervised learning. In some embodiments, the weights are trained using backpropagation, a supervised learning method.

In some embodiments, a signal from a reference oscillator is fed back into the training system, and an error signal representing the difference between the reference signal and the output signal is analyzed in view of one or more temperature inputs. In other embodiments, no reference signal is used. Training may involve subjecting the oscillator unit to a range of temperatures and recording output measurements at discrete intervals. For example, readings may be taken in 1° C. increments, and may be taken over a temperature range. In some embodiments, temperature readings are taken over a range of approximately 0-7° C. In some embodiments, readings are taken over a range of approximately 5°, 10°, 15°, or 20° C., or more. In yet another embodiment, readings are taken over a range of more than 120° C., such as over the range of approximately −45° C. to 90° C., as shown in the embodiments of FIGS. 6A-6D. The test data may be used by the system to calculate the input weights to the system. In some embodiments a computer processor solves for the required weights and bias, or biases, to achieve a curve that matches the crystal frequency over temperature as closely as possible. Such calculation may be implemented using a least-squared solution, and may involve a gradient-reduction search. For example, the squared error at each measured temperature point could be summed together, with the minimum squared error over the temperature range being solved for, as well as the corresponding weights that produce such error.

With respect to a particular task or ANN application, one training method may provide advantages over another. In some embodiments, weights of an ANN may be randomly seeded ("Method 1"). However, for reasons disclosed below, such methodology may not provide ideal performance and/or efficiency. For example, with respect to a sigmoid-based activation function, known characteristics of such functions may be leveraged to intelligently select starting values that allow for potentially better and/or more efficient solutions to be obtained than by using random seeding ("Method 2," discussed in greater detail below). Furthermore, preselecting "areas of interest" for individual neurons may also improve selection/performance.

Some embodiments of ANN training methods include taking the entire network as a whole and applying the solution algorithm to an associated matrix. However, such solution algorithms may have a tendency to get stuck in local minima. Furthermore, the ANN and solution space itself may result in adverse effects. For example, as the solution space grows in complexity, the number of neurons needed to fit the curve generally increases, thereby increasing the number of weights that are iterated in the solution. Such increase can create additional local minima that can potentially hamper the solution algorithm.

Figure 6A:
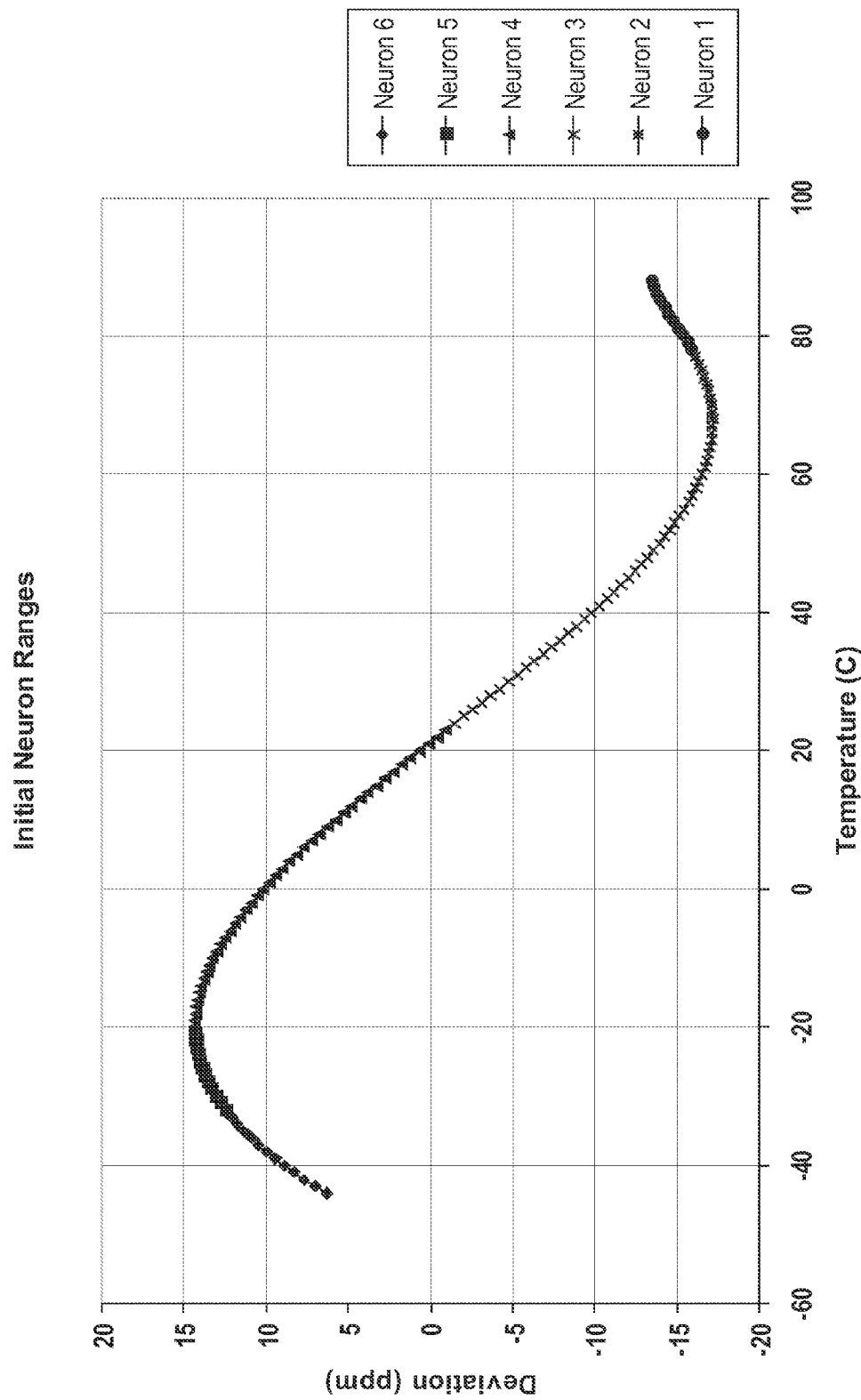
FIG. 6A is a graph showing an embodiment of neuron division over a temperature range for training purposes.

FIG. 6A is a graph showing how neurons may initially be divided over a set of sample data. As shown, in some embodiments, different neurons are trained over different initial temperature ranges. From the initial ranges for each neuron, it may be possible to preselect values that set the slope, delay and/or amplitude such that an initial solution of the neuron is relatively close to, or within an acceptable proximity of, a final solution associated with the neuron. From these initial solutions, each neuron can be solved over its associated temperature range/space, which may result in improved curve fit over the respective range of interest.

Figure 6B:
FIGS. 6B-6D provide graphs representing potential embodiments of solutions for portions of the sample fit shown in FIG. 6A.
Figure 6C:
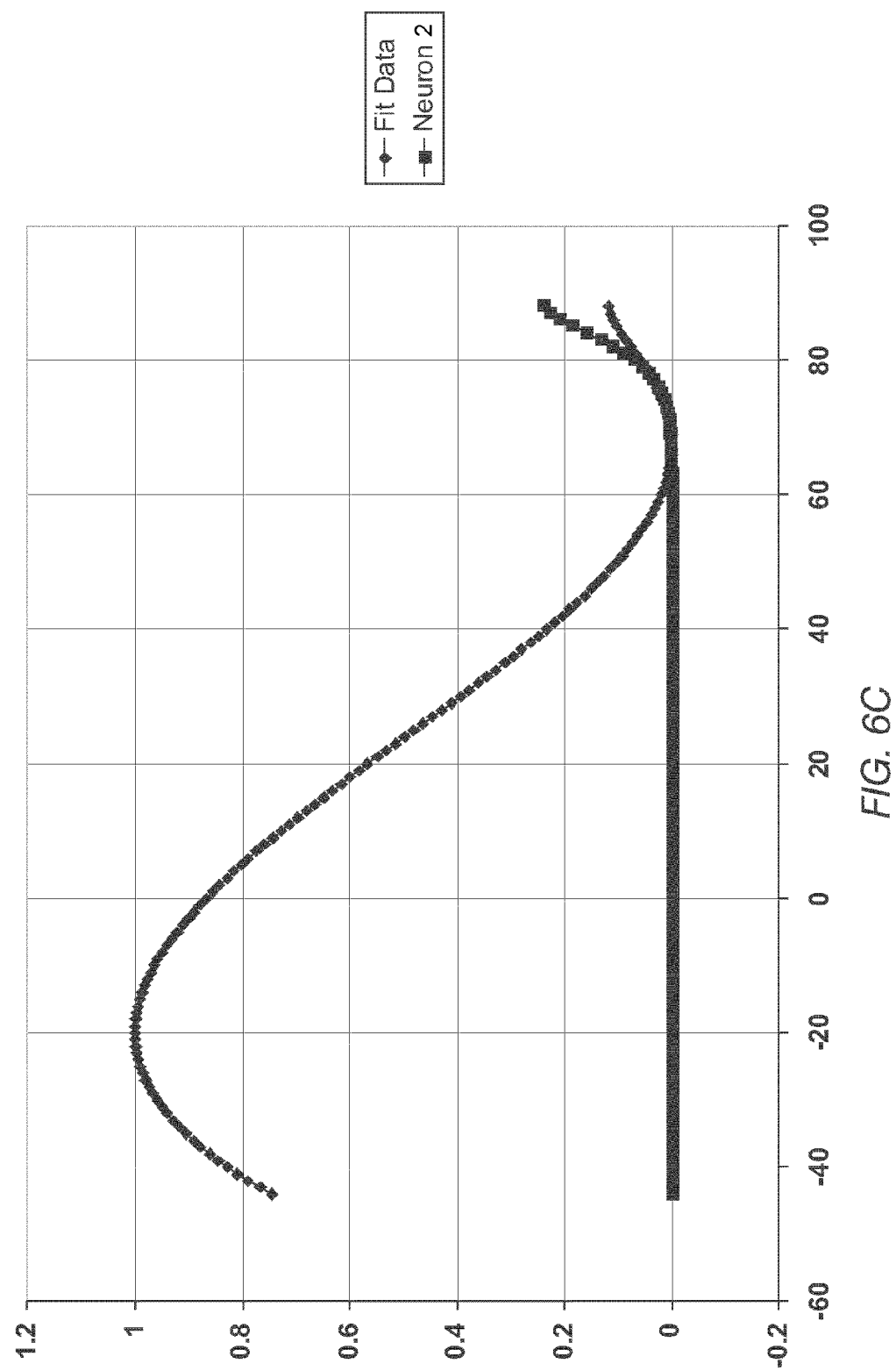
Figure 6D:
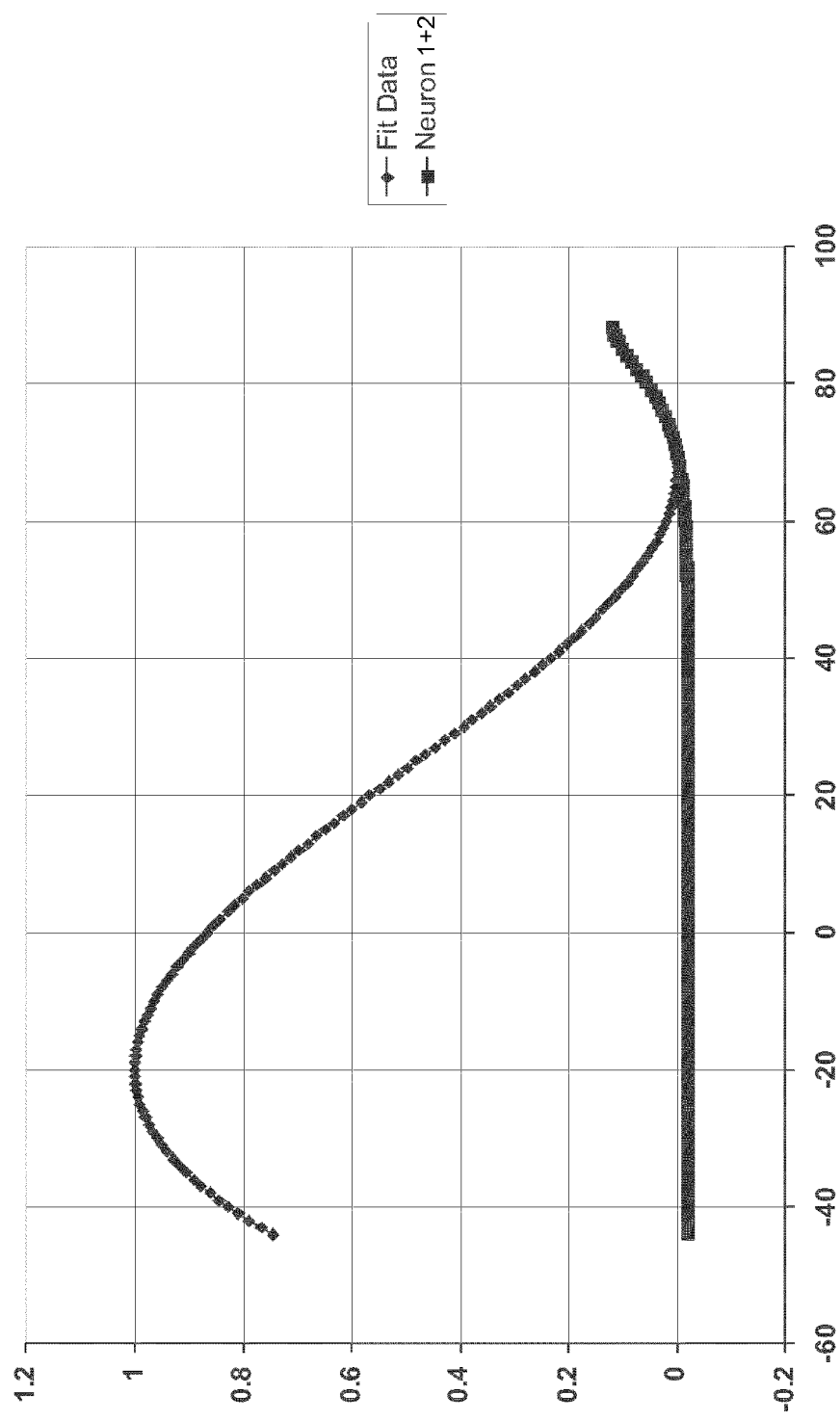

FIGS. 6B-6D provide graphs representing potential solutions for portions of the sample fit shown in FIG. 6A. For example, FIG. 6B shows an example curve fit after gradient reduction has been performed on a first neuron (e.g., Neuron 1). As shown, the curve fits the relevant data relatively well over an area of interest, but is uncontrolled outside the area of interest. In some embodiments, the contribution outside the area of interest is advantageously near "0." This may make remaining calculations for the solution relatively simpler. FIG. 6C shows an example curve fit after gradient reduction has been performed on a second neuron (e.g., Neuron 2). Similarly to the curve of Neuron 1, the curve of FIG. 6C fits the relevant data relatively well over the corresponding area of interest, as defined in FIG. 6A. Furthermore, outside of the area of interest, the curve's contribution is near to "0" to the left and a somewhat close fit to the right of the area of interest.

FIG. 6D provides a graph representing a potential solution that is based on a summation of the curves of Neurons 1 and 2, as described above, after such summation has been run through a gradient reduction to reduce its sum squared error. The combined solution for Neuron 1 and Neuron 2 over the combined areas of interest for Neuron 1 and 2 substantially matches the fit data.

The example areas of interest of FIGS. 6B-6D provided the benefit of having solutions around local minima at a deviation close to 0. Furthermore, the associated data set shown may be considered a relatively simple data set. These factors may allow for individual solutions to be near "0" in certain regions outside of the area of interest, which may make the summation solution much easier to calculate. In more complex data sets, such may not be the case, and the interactions may not be as easy to visualize.

A comparison of performance of an ANN frequency controller trained using an embodiment of Method 1 to a controller trained using an embodiment of Method 2 is outlined below in Table D. As stated above, Method 2 corresponds to a method in which neurons are intelligently placed and seeded, and the individual neurons are trained and then the sums are trained. The first entry in Table D is labeled Method 1, and shows an example sum-squared error and peak-to-peak residuals. The second entry corresponds to Method 1 calculated for the whole matrix, which is similar to the method described above, but the whole matrix is solved after the intelligent placement and seeding. In some embodiments, no individual solutions or walking sums are trained. The solution may have almost three times as much residual error. Finally, the last 5 entries correspond to Method 2, wherein random seeds are used and the entire matrix is solved at once. One can see that none of the 5 solutions are even close to the Method 1 solutions, and they generally tend to fall into the same local minima producing nearly duplicate results around 11.27 and 4.5 for residual error.

TABLE D

| Method | Sum squared Error | Residual pk-to-pk (ppm) |
| --- | --- | --- |
| Method 1 | 0.065301276 | 0.120511 |
| Method 1 - whole matrix | 0.367575503 | 0.349724 |
| Method 2 - whole matrix 1 | 391.7005882 | 11.27486 |
| Method 2 - whole matrix 2 | 93.00323905 | 4.58059 |
| Method 2 - whole matrix 3 | 391.7005899 | 11.27485 |
| Method 2 - whole matrix 4 | 101.3273131 | 4.523202 |
| Method 2 - whole matrix 5 | 101.6971708 | 4.447988 |

Method 1 may provide curve fitting functionality to the level of accuracy that is needed for the ANN compensation to be effective. On the other hand, using Method 2 may render the ANN compensation unusable in some embodiments. By using more neurons than shown above, the residual peak-to-peak error of this solution can be driven down to under 0.020 ppm in some embodiments. This level of curve fitting may not be feasible with the industry standard $5^{th}$ order polynomial.

Figure 8:
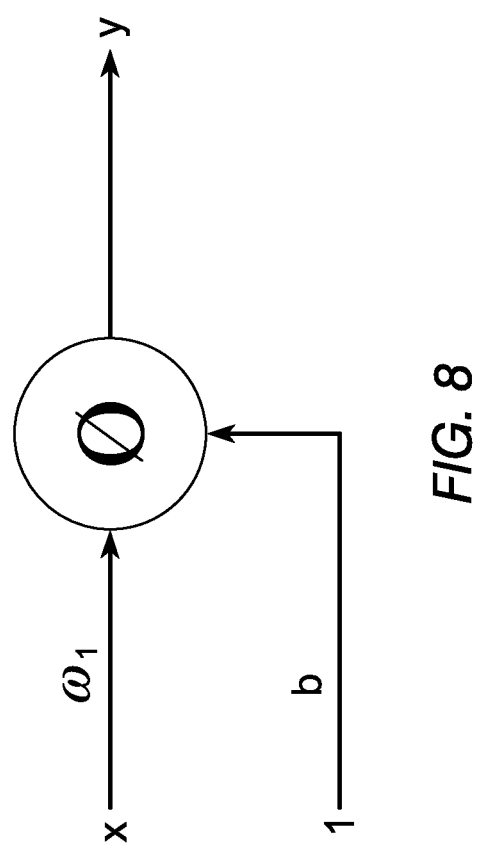
FIG. 8 is a schematic diagram of an embodiment of a neuron.

FIG. 8 illustrates a block diagram of a neuron that may be used in a curve-fitting application. In some embodiments, the activation function associated with the neuron is a uni-polar sigmoid activation function. The neuron may include a single weight, $\omega_1$ and two biases, b and a (not shown). Such a configuration may be computationally beneficial in that it may comprise fewer values to solve for than multi-input, multi-connected networks. In an embodiment configured for oscillator temperature compensation, the input 'x' may represent temperature, for example. In some embodiments, as shown in FIG. 8, the bias is fixed at a value of '1'. In curve-fitting embodiments, the output, 'y', may be a desired signal correction corresponding to operation of an electronic oscillator. This output level may be converted to a correction voltage using the mV/ppb sensitivity of the oscillator, or by any other available mechanism.

In some embodiments, the activation function of the neuron depicted in FIG. 8 may be a uni-polar activation function conforming to the following equation:

$$\emptyset = \frac{1}{1 + e^{-\alpha(\omega x + b)}} \quad (3)$$

The activation function can include at least three variables, the modification of which will alter the shape and/or position of the output signal. In some embodiments, the values of one or more of the variables $\alpha$, $\omega_1$ and b are iteratively calculated during the training phase of the ANN. In some embodiments, one or more of the variables is set to a constant value of either 0 or 1.

FIG. 9A is a graph that demonstrates the effect that the weight $\omega_1$ has on the sigmoid activation function output. As is shown in the graph, adjustment in the value of $\omega_1$ adjusts the amplitude of the signal, wherein a higher value of $\omega_1$ generally results in greater amplitude. This effect may be more clearly illustrated when the bias, b, is non-zero, and α is something other than unity.

FIG. 9B is a graph that demonstrates the effect that the bias weight, b, has on the sigmoid activation function output. As is shown in the graph, adjustment of the value of b, which may be temperature in the case of oscillator curve fitting, shifts the sigmoid curve to the left or right. As shown, a negative value of b may generally cause a shift to the right, while a positive value of b causes a shift to the left. In an application where the input is temperature, as shown in the figure, modification of the value of b may in effect shift an individual sigmoid function's output in response to an input temperature.

FIG. 9C is a graph that demonstrates the effect of a on the sigmoid activation function output. As is shown in the graph, the slope of the sigmoid curve is controlled by the value of α. By changing the sign of α, the sign of the slope of the activation function output may also be changed (e.g., from positive slope to negative slope). In some embodiments, the slope of the sigmoid is set at either 1 or −1 to obtain the direction of slope desired, and the $\omega_1$ and b weights are solved for. This approach may make the solution of the system easier to obtain computationally. However, such an approach may also increase the number of neurons required to obtain a satisfactory fit of the curve. In some embodiments, rather than setting α to a constant value, the value of α is solved for. Iteratively solving for a may help reduce the number of neurons necessary to fit a curve of interest. By controlling the slope of a sigmoid curve, rather than using a constant value for α, it may be possible to achieve a curve fit that otherwise would require summing multiple curves together, in this case sigmoid-shaped curves. Furthermore, this approach may provide more versatility from each neuron in the network, increasing the precision of the system.

FIGS. 9A-C show that, in certain three-variable embodiments, the sigmoid amplitude, slope, and delay (left/right position) can be controlled. Multiple neurons may be summed together to create more complex functions. In regard to the application of oscillator compensation, there may also be a need or desire to shift the sigmoid up and down as a frequency adjust. In some embodiments, if the ANN structure in FIG. 7 is used, a user may have no ability to shift the sigmoid functions up and down. For example, the output layer of the network, $\varnothing_3$, may be another sigmoid shaped neuron, which may not allow for up/down shifting of the signal. To address this problem, in some embodiments, the ANN structure of FIG. 7 may be altered. The output neuron may be replaced with a linear summation module, which may have its own input weights, output weights, and/or dedicated bias. Such an embodiment is described below in further detail with respect to FIG. 10. In such an embodiment, the linear summer bias value 'b' may provide the network with a frequency adjust (up/down shift).

Figure 10:
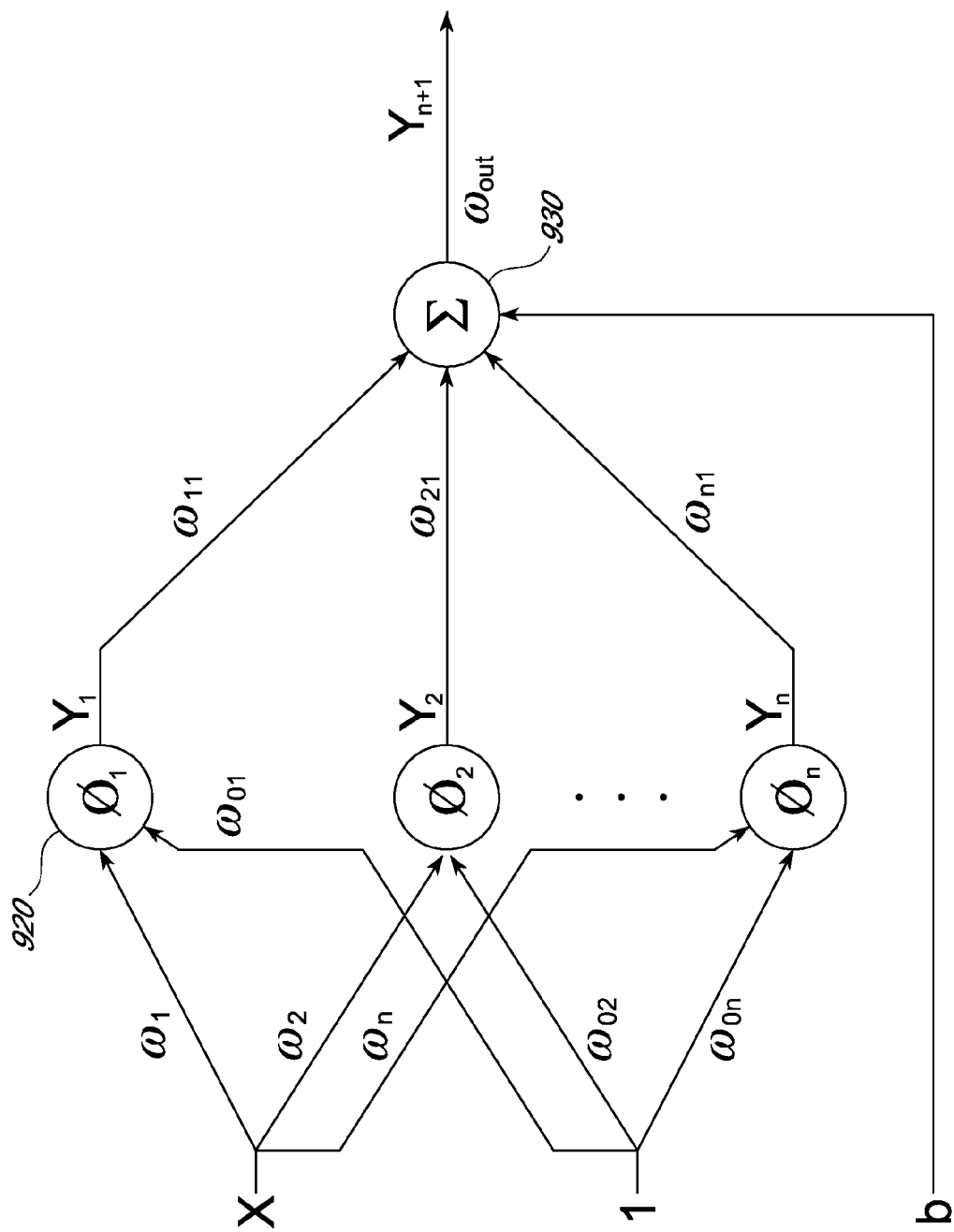
FIG. 10 is a schematic diagram of an embodiment of a neural network.
Figure 15:
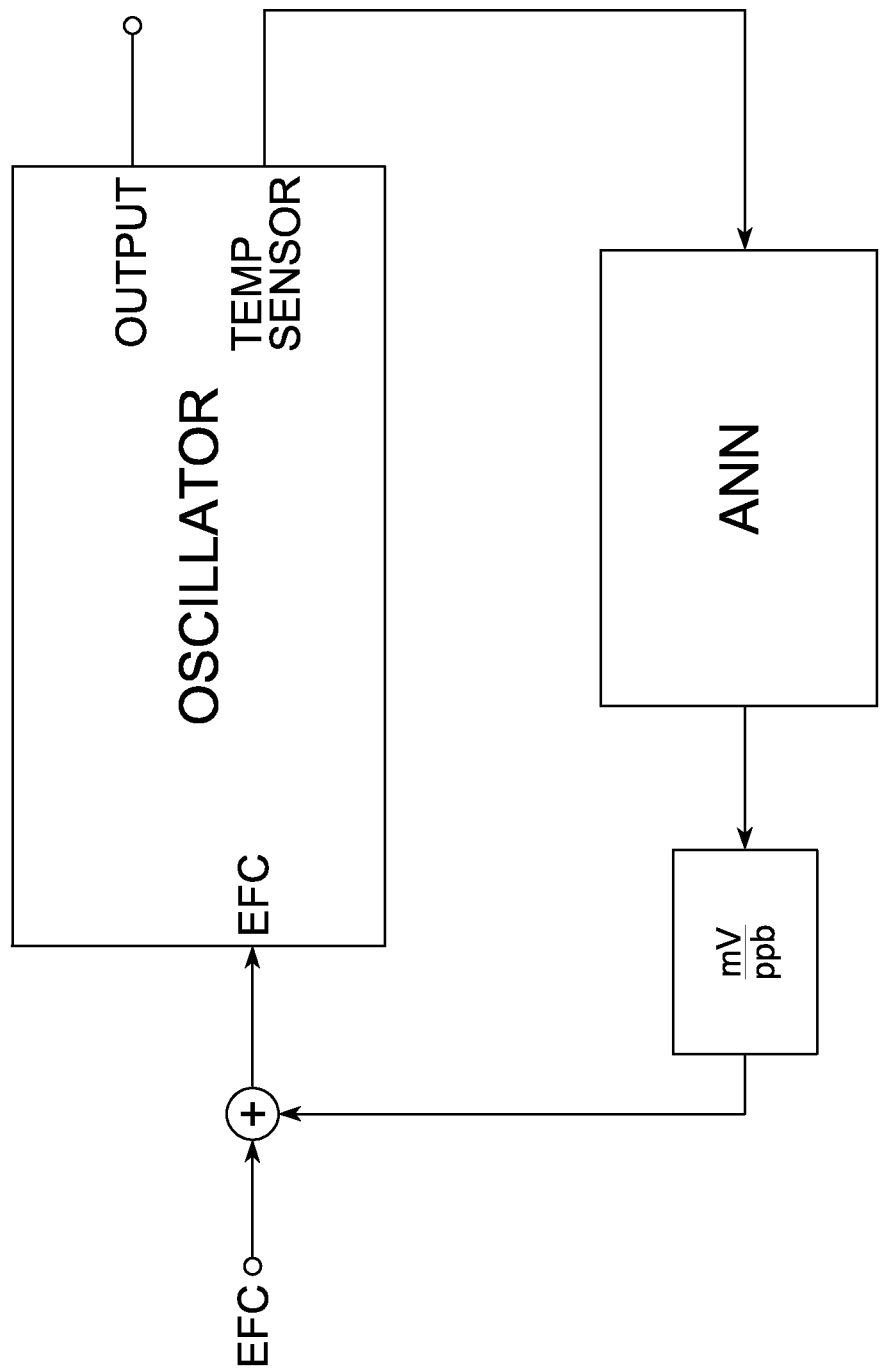
FIG. 15 is a block diagram of an embodiment of a neural network temperature compensation system.

FIG. 10 illustrates an embodiment of an ANN architecture that may be used for curve fitting applications. In some embodiments, the system of FIG. 10 is used in temperature compensation of electronic oscillators, such as crystal oscillators. The network includes a layer of neurons, $\varnothing_1, \varnothing_2 \ldots \varnothing_n$, each connected to two inputs, one of which may be tied to a value of 1. The network shown in FIG. 10 uses a single input voltage X (which may represent temperature). After being trained, the network may provide a signal output corresponding to the deviation in ppm. Certain data modeled herein was normalized to meet the "0" to "1" level of the sigmoid functions in the network, and therefore it may be necessary for such data to be decompressed. A weight may be applied to the output in order to decompress the model and provide corrected output deviation. Furthermore, the output itself may be the deviation. To create a compensation voltage, the signal may be converted into a voltage that will steer the oscillator in the opposite direction of the deviation. FIG. 15, discussed in further detail below, shows a block diagram of an oscillator system including gain blocks that may be used to achieve this goal.

The network may include any desirable number of neurons in the first layer. For example, the network may include only a few neurons in the first layer, or may include 25, 30, 33, 40, or any other number of neurons. The number of neurons chosen may affect the ability of the system to effectively fit the desired curve. For example, adding additional neurons to the network may increase the degrees of freedom of the system. In some embodiments, each of the inputs to the various neurons in the network is multiplied by an independently calculated weight (e.g., $\omega_1, \omega_2 \ldots \omega_n$). The output of each of the neurons ($Y_1, Y_2 \ldots Y_n$) in the network is provided to a second layer that comprises a linear summation module 930.

In some embodiments, the network of FIG. 10 is governed by the following equations:

$$\varnothing = \frac{1}{1 + e^{-\alpha(z_k)}}; \quad (4)$$

$$\varepsilon_n = \omega_n(x) + \omega_{0n}; \quad (5)$$

$$y_{n+1} = y_1\omega_{11} + y_2\omega_{21} + \ldots + y_n\omega_{n1} + b; \quad (6)$$

wherein α=slope of the sigmoid curve.

The system embodied in FIG. 10 may provide a number of advantages over certain other embodiments. As discussed above, a may be iteratively calculated in the solution matrix. This may reduce the number of neurons needed to obtain a precise fit. A reduced number of neurons may aid in reducing the footprint and power consumption of a device implementing the embodied system. Furthermore, the network illustrated in FIG. 10 includes as a second layer a linear summer 930 with independent weights and bias, as opposed to a neuron operated on by an activation function. In some embodiments, the system includes a hidden layer with the same activation function as the input layer. In some embodiments, the output layer does not include a linear summer, and may include another activation function. As mentioned above, the bias for the first layer of neurons imposes a left/right shift, which may represent temperature in a temperature compensation application. While the system of FIG. 10 may include a temperature input from a single temperature sensor, some embodiments employ the use of multiple temperature sensors. Such a system may be desirable in cases where different portions of a unit experience different temperatures, such that more accurate temperature determination is possible with multiple sensors. However, additional temperature sensors would require more inputs to the system, affecting the complexity of the system, while possibly providing greater accuracy.

The bias, b, for the linear summer, imposes an up/down shift which may perform a frequency adjustment for the entire curve. Without frequency adjustment, it may be difficult to obtain a good fit because the network, while mimicking the shape, may not be able to "overlay" the curve in a desired shape.

In some embodiments, an ANN for use in frequency control may be implemented with a hardware model. For example, an ANN frequency controller may be implemented in a custom application-specific integrated circuit (ASIC). In some embodiments, an ANN is built using discrete circuit components.

Figure 11:
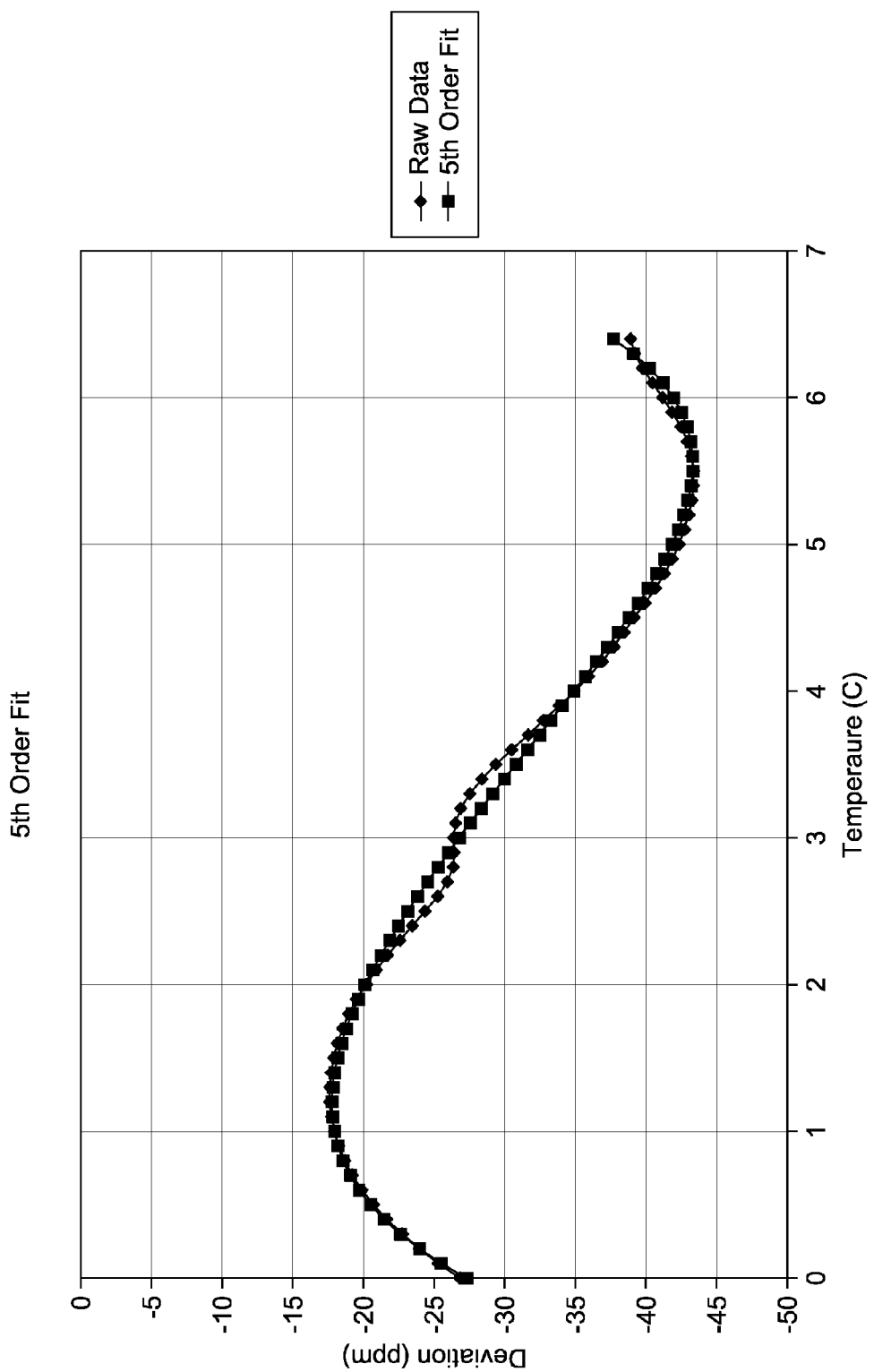
FIG. 11 is a graph showing test data relating to oscillator temperature response.

Neural network frequency control may be implemented using an idealized computer model. FIGS. 11-14 comprise example data demonstrating potential performance of an embodiment of an ANN frequency controller vis-à-vis the performance of a system using a curve-fitting polynomial function generator. With respect to the ANN system, crystal data was submitted to the network to be fitted. The same data was also submitted to an idealized $5^{th}$ order polynomial function. FIG. 11 shows the data set and the resulting $5^{th}$ order fit. This data was selected in particular because it was from a discrete oscillator having a characteristic general inability to compensate certain crystals due to distortion. The curve with data points represented by diamonds represents the raw data, while the curve with data points represented by squares represents the $5^{th}$ order fit.

Figure 12:
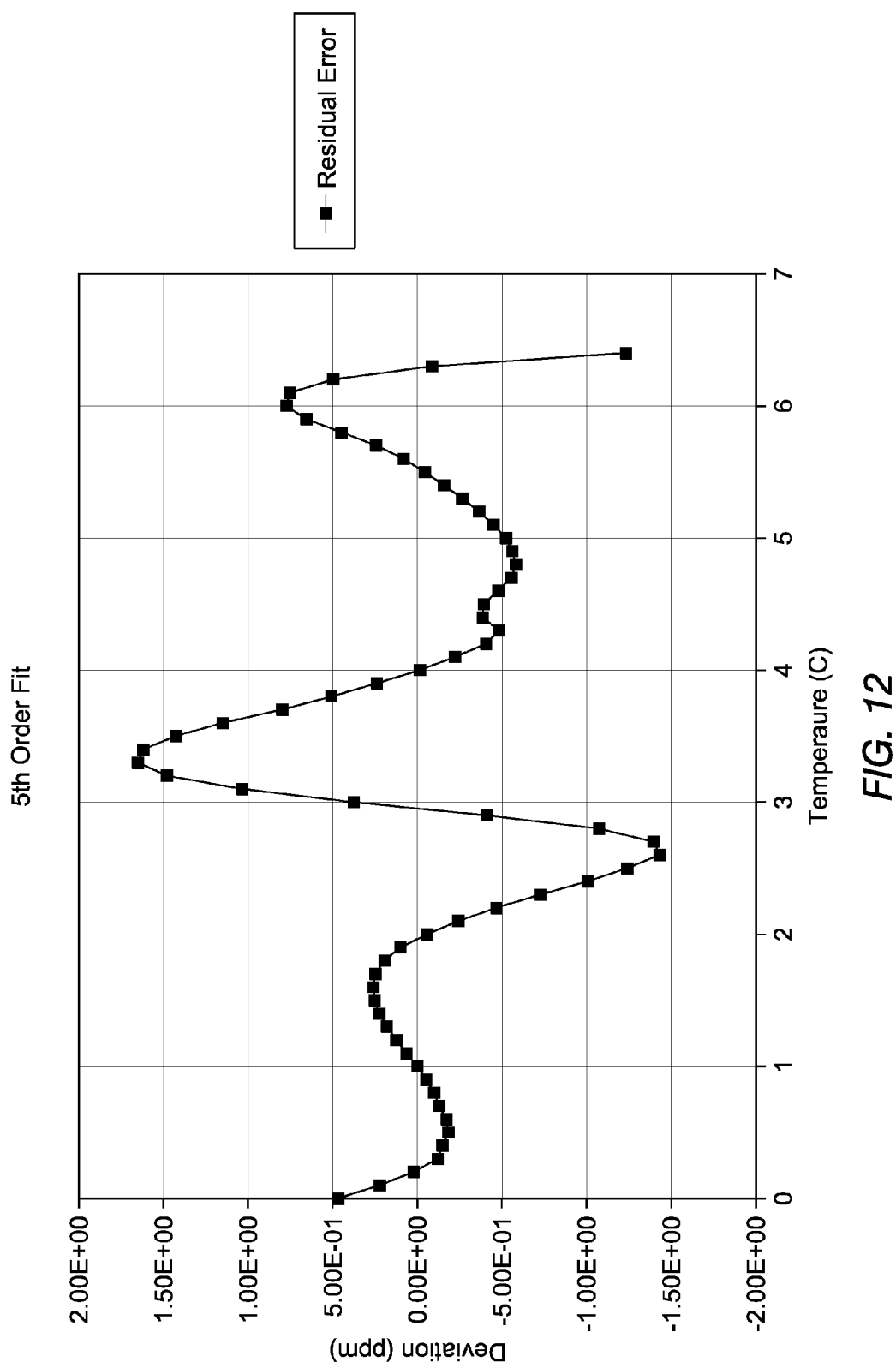
FIG. 12 is a graph showing test data relating to error of a polynomial function generator.
Figure 13:
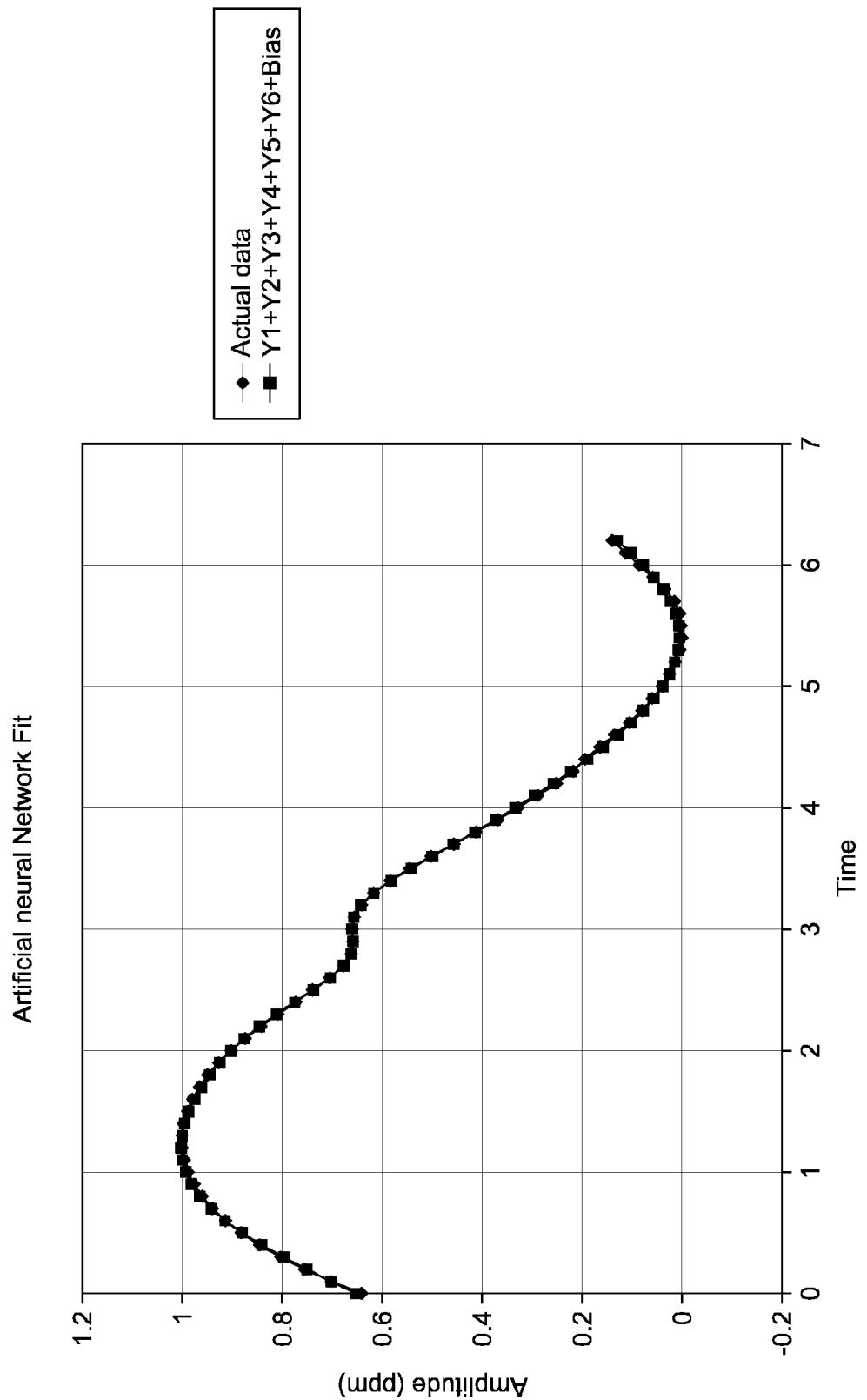
FIG. 13 is a graph showing test data relating to performance of an embodiment of neural network frequency controller.
Figure 14:
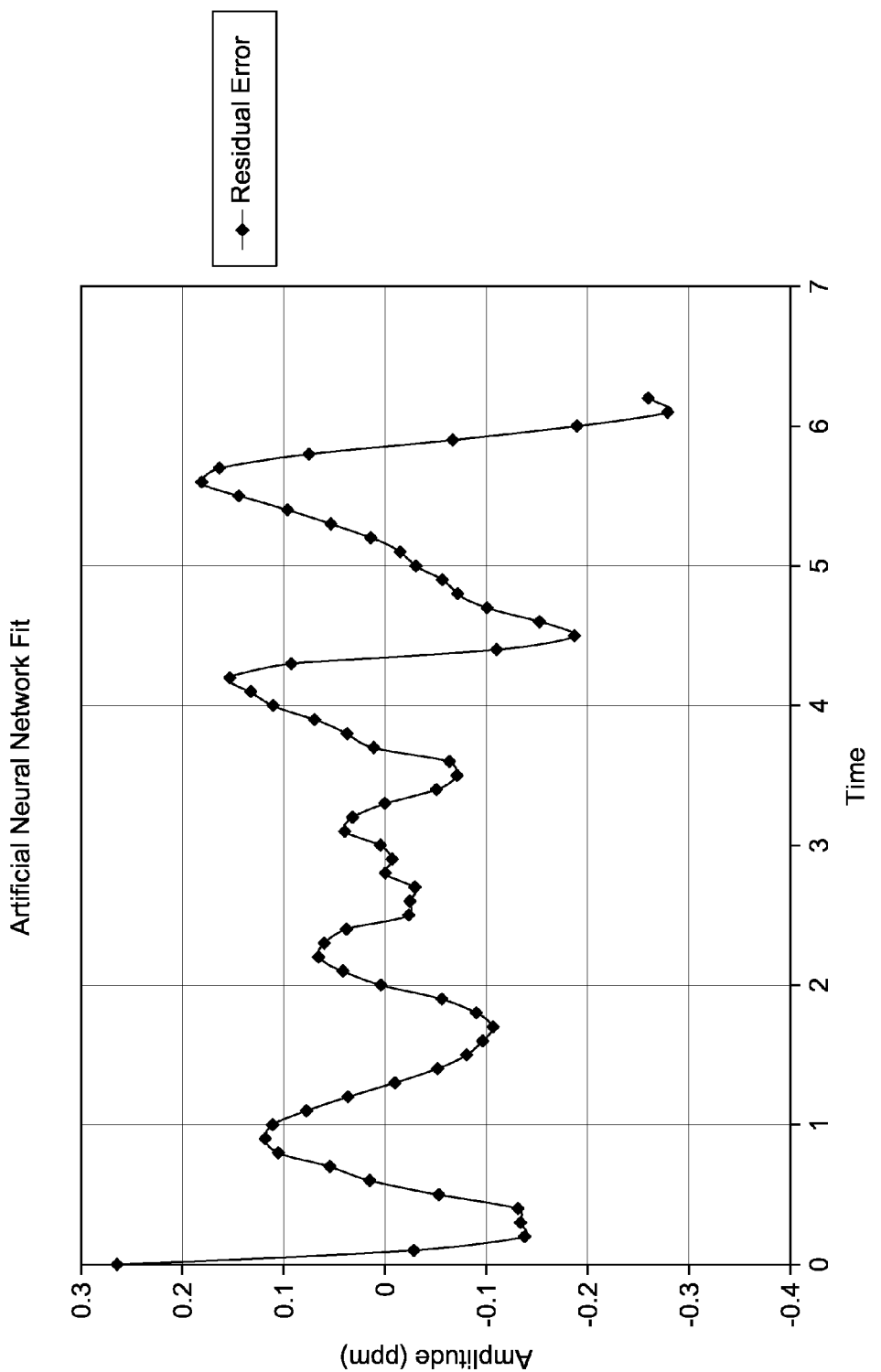
FIG. 14 is a graph showing test data relating to error of a neural network frequency controller.

FIG. 12 shows the potential residual error between the $5^{th}$ order fit and the raw data. The magnitude of the error, particularly at the example data points at approximately 2.6° C. and 3.3° C., may be unacceptable for real-world oscillator applications. By certain standards, a residual error of roughly +/−1.5 ppm may effectively designate a tested crystal as a throw away crystal, and may fall short of certain application requirements, such as, for example, a requirement that residual error not exceed +/−0.5 ppm. This same data was submitted to an embodiment of an ANN constructed in accordance with the embodiment described in connection with FIG. 10. FIGS. 13 and 14 show the fit of the neural network controller to the raw data, and residual error, respectively. The ANN embodiment tested comprised six neurons. As is shown in FIG. 14, the residual error of the ANN fit may be approximately +/−0.3 ppm. Therefore, the error from an idealized $5^{th}$ order curve fit may be reduced by approximately a factor of 5 through use of an ANN temperature compensation system. Furthermore, the error of the ANN controller meets application requirements for stability requiring error to be within +/−0.5 ppm.

ADDITIONAL EMBODIMENTS

Some of the embodiments disclosed herein may be suited for temperature-compensated crystal oscillators (TCXO). Furthermore, principles disclosed herein are applicable to compensation for a host of other problems. In some embodiments, ANN's are utilized as secondary compensation of oven-controlled crystal oscillators (OCXO). Application of secondary neural network temperature compensation to an OCXO may allow for performance levels approximating double oven performance from a single oven. Other non-limiting example applications may include TCXO warm-up compensation, TCXO trim effect compensation, OCXO transient response compensation, and others.

The use of an ANN to compensate for various parameters in oscillator performance may be realized as a temperature-compensated crystal oscillator ("TCXO"), an oven-controlled crystal oscillator ("OCXO"), a microcomputer compensated crystal oscillator ("MCXO"), or any other frequency control application, such as a micro-electronic mechanical system oscillator ("MEMS") or chip-scale atomic clock ("CSAC"). The measurement of various parameters associated with a frequency standard device may be accomplished with a single electrical sensor, a plurality of electrical sensors, or by other means. A system in accordance with this disclosure could be constructed as an ASIC or Discrete Analog Hardware, or system functions may be synthesized through a microprocessor, or other means.

In addition to temperature compensation, ANN's may be used in a wide range of curve fitting applications. A number of embodiments of such systems are described below. However, the particular embodiments discussed do not limit the applicability of neural network controller systems. The example embodiments below utilize a uni-polar sigmoid activation function, Ø, for individual neurons. The uni-polar sigmoid function, as discuss above, is defined as:

$$\emptyset = \frac{1}{1 + e^{-\alpha(\omega x + b)}} \tag{7}$$

However, in certain multi-input neuron embodiments, the (ωx+b) portion of the above equation is a sum of all inputs times all weights, as will be illustrated below. While the uni-polar sigmoid function is discussed herein, any suitable activation function may be used.

Figure 16:
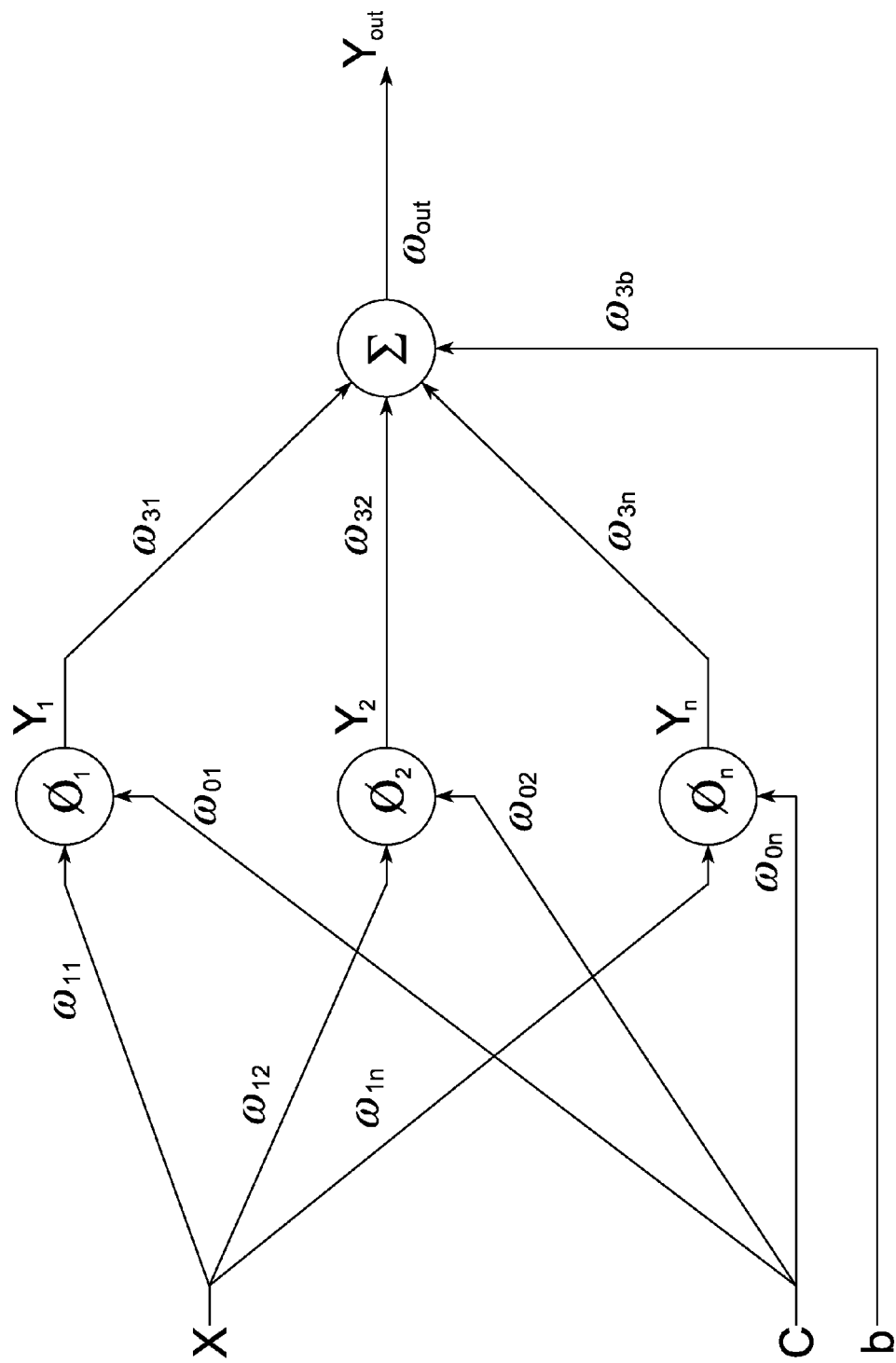
FIG. 16 is a schematic diagram of an embodiment of a neural network temperature compensation system.

FIG. 15 provides a block diagram of an ANN temperature compensation system, while FIG. 16 shows a schematic diagram of such an ANN system. In some embodiments, the system may include a quartz crystal oscillator, or any other suitable oscillator. For example, suitable oscillators may include oscillators that are tunable via a voltage control, such as voltage-controlled oscillators (VCO's). The voltage control may be externally controllable by a user, or may be controlled internally.

Figure 17:
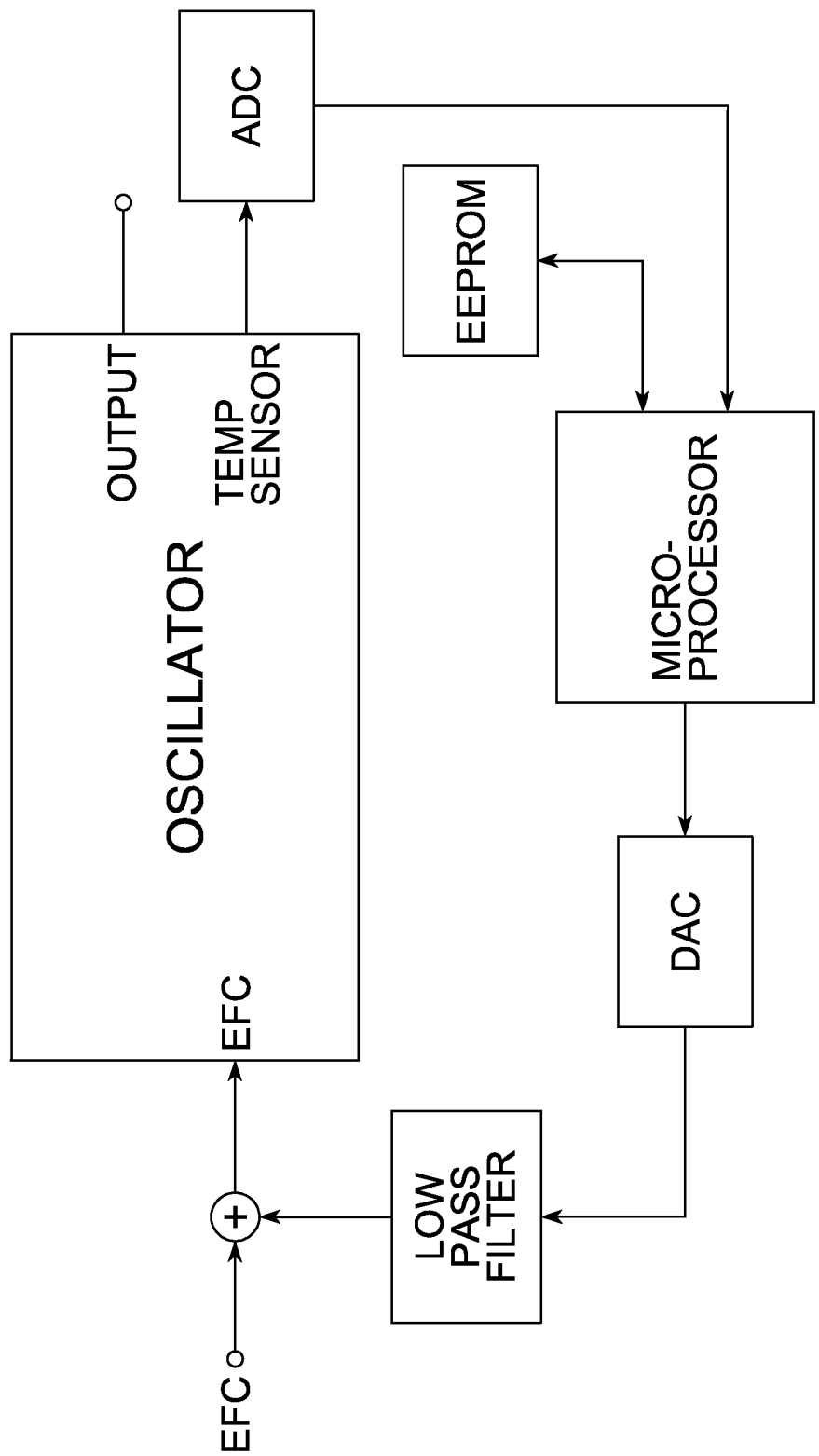
FIG. 17 is a block diagram of an embodiment of a neural network temperature compensation hardware system.

FIG. 17 provides a block diagram illustrating a hardware embodiment of the ANN temperature compensation system shown in FIG. 15. The trained weights for the ANN may be stored in an EEPROM, or other type of memory module. Each neuron may include three or more variables that are to be trained (e.g., ω, b, and α). However, as shown in equation (3), α may be distributed in the quantity $z_k$. After training, in some embodiments, distribution can be implemented such that what is stored in the EEPROM are the quantities αω and αb. This may reduce the storage requirements for each neuron down to two quantities. The network may also have to store values for b and/or $\omega_{out}$. Therefore, for example, an embodiment comprising 25 neurons for primary compensation may require approximately 52 values to be stored, whereas a 33-neuron embodiment may require approximately 68 values to be stored.

In some embodiments, the microprocessor shown in FIG. 17 samples a temperature sensor using an ADC. Output from the ADC may then be input to the microprocessor which calculates the ANN's response, and the output is converted back into a voltage signal using a DAC. In certain hardware embodiments, approximately seven corrections can be applied to the oscillator per second, advantageously providing tracking under fast temperature-ramp conditions. A low-pass filter may be incorporated to prevent the output frequency from having a step function response to the corrections.

In the embodiment of FIG. 17, the temperature sensor may reside inside the oscillator unit as near to the resonator as possible to reduce temperature gradients between the sensor and the resonator. In some embodiments, the temperature sensor is the sole input to the ANN. The ANN may learn the oscillator's temperature characteristics through a training process and allow a correction voltage to be created that is then fed into the control voltage input (EFC) pin of the oscillator. The correction voltage may be summed in with a user's desired EFC voltage in this embodiment.

In the schematic diagram of FIG. 16, 'X' may represent a temperature sensor input and 'b' and C may represent some constants which can be any real number. The respective weights may be actively solved for. In some embodiments, for ease of calculation, they may be set to 1. It is not necessary that the number of neurons be set to any particular number, and such number may be determined dependent on the complexity of the curve to be fitted. The formula for such an embodiment may be as follows, with 'n' representing the number of elements:

$$Y_n = \frac{1}{1 + e^{-a_n(\omega_{1n}x + \omega_{en}b)}} \quad (8)$$

$$Y_{OUT} = \omega_{31}Y_1 + \omega_{32}Y_2 + \ldots + \omega_{2n}Y_n + b\omega_{2b} \quad (9)$$

Figure 18:
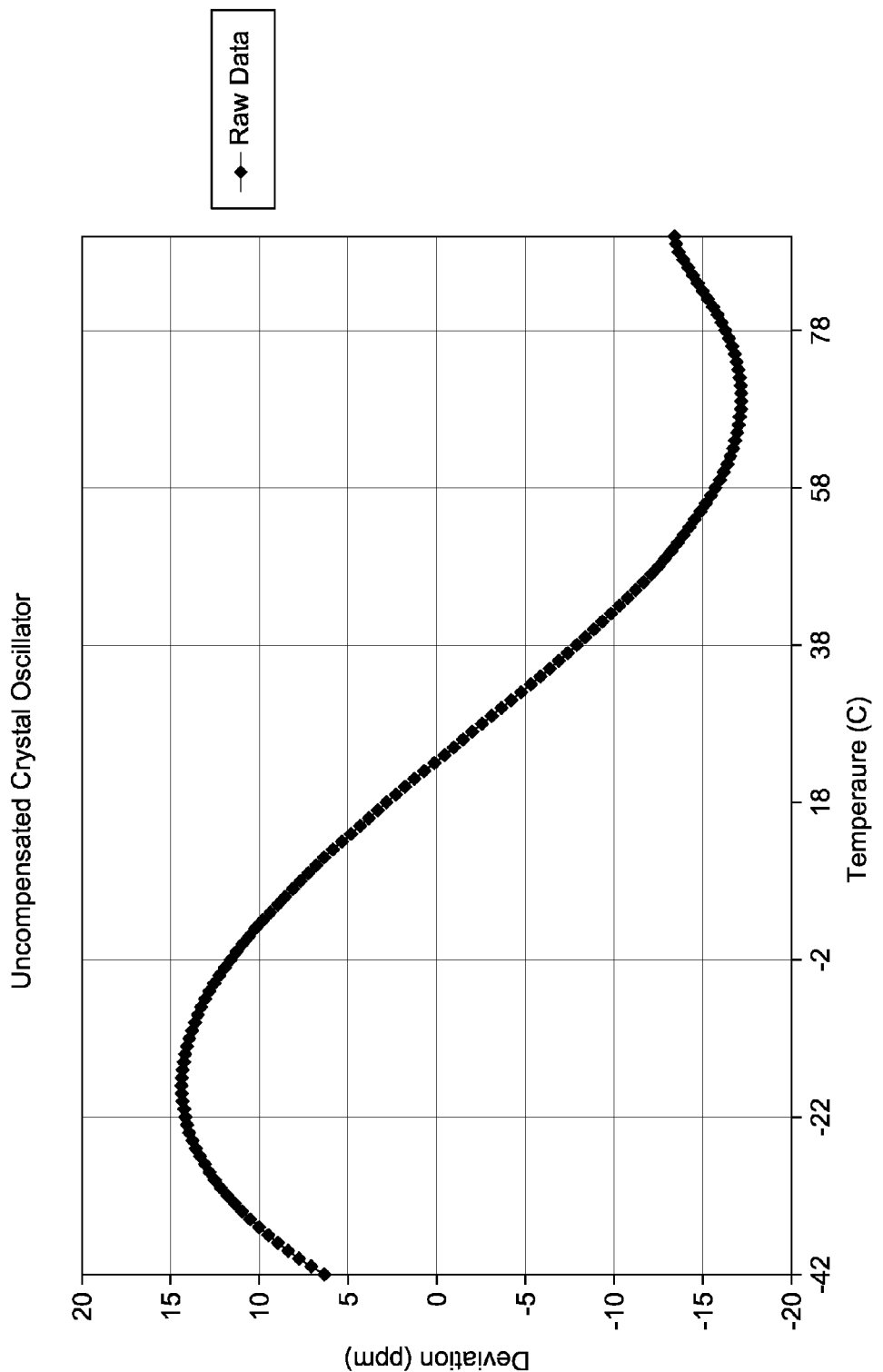
FIG. 18 is a graph showing data relating to oscillator temperature response.

FIG. 18 provides potential results associated with an uncompensated crystal oscillator over a temperature range. An uncompensated crystal may have a total deviation of over 30 ppm. In view of this uncompensated crystal performance, it may be helpful to analyze performance of some embodiments of ANN temperature-compensated crystal oscillators. The analysis below of possible ANN temperature compensation performance includes two different embodiments. The analysis relates to the use of a TCXO, such as a 10 MHz T70 series TCXO's manufactured by Greenray Industries, Mechanicsburg, Pa. Such a TCXO may be useful for various reasons. First, the relatively small size of the TCXO, which may be approximately 7 mm long by 5 mm in width, may be ideal for certain applications. Another reason is that the oscillator die may be in a ceramic package with a Statek AT-cut strip crystal, which is also in a ceramic package, mounted on top. This construction may provide good thermal design, which has excellent thermal coupling between the temperature sensor on the die and the crystal.

In a first embodiment, a TCXO's internal compensation may be disabled so that the crystal is uncompensated and the ANN provides substantially all of the compensation. This may be helpful in evaluating the ANN as a primary compensation schema for AT-cut strip crystals. The temperature range for the analysis may include approximately −42° C. to +86° C. The ANN may then be trained using this data set, and the oscillator run over a temperature range again with the ANN compensation engaged, to evaluate the ANN compensation performance.

In a second embodiment, compensation may be done using a similar TCXO and crystal type as described for the first embodiments, but with the TCXO's internal compensation engaged. For example, the TCXO may be compensated with an internal $5^{th}$-order polynomial generator. Such analysis may be helpful in evaluating the ANN as a secondary compensation schema for state of the art TCXO's. As in the first embodiment, the temperature range may include approximately −42° C. to +86° C. The data from such a run can then be used to train the ANN. The unit may then be rerun over the temperature profile with the ANN engaged to evaluate the ANN compensation performance.

Figure 19:
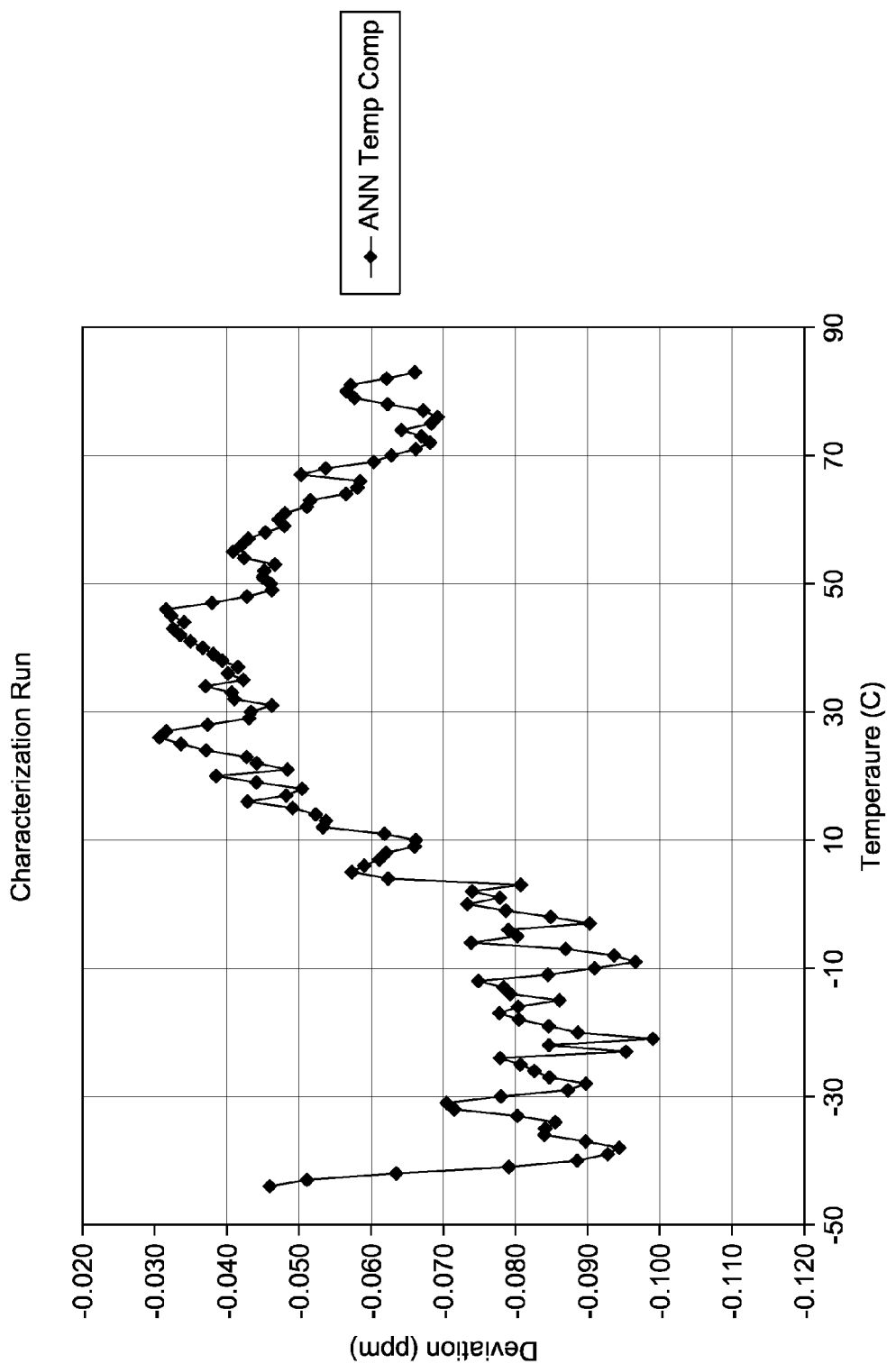
FIG. 19 is a graph showing data relating to performance of an embodiment of neural network temperature-compensation frequency controller.

In FIG. 18, it is shown that in some embodiments an uncompensated oscillator may have a deviation over temperature of approximately +/−15.74 ppm. Using this data to train the ANN in the first test embodiment, including, e.g., an ANN with 25 neurons, FIG. 19 shows potential results after training the network and applying the compensation. The deviation after the ANN compensation is applied may be approximately +/−0.035 ppm. Such compensation may represent an improvement of approximately 450 to 1 over certain conventional methods.

One consideration in determining what type of oscillator to use for primary temperature compensation is how much of the oscillator's pullability is used by the compensation. In some embodiments, compensation uses almost all of the oscillator's pullability, leaving the user little or no ability to adjust the frequency. The residual error shown in FIG. 18 still has significant content that could be fit if more neurons were used in the network. However, due to the limit on pullability, better compensation may not be realizable on such an oscillator. In some embodiments, a different oscillator design may be employed for the purpose of primary temperature compensation. For example, it may be desirable for an oscillator utilized to be designed to have enough frequency pull to accommodate temperature compensation as well as user frequency adjust.

Figure 20:
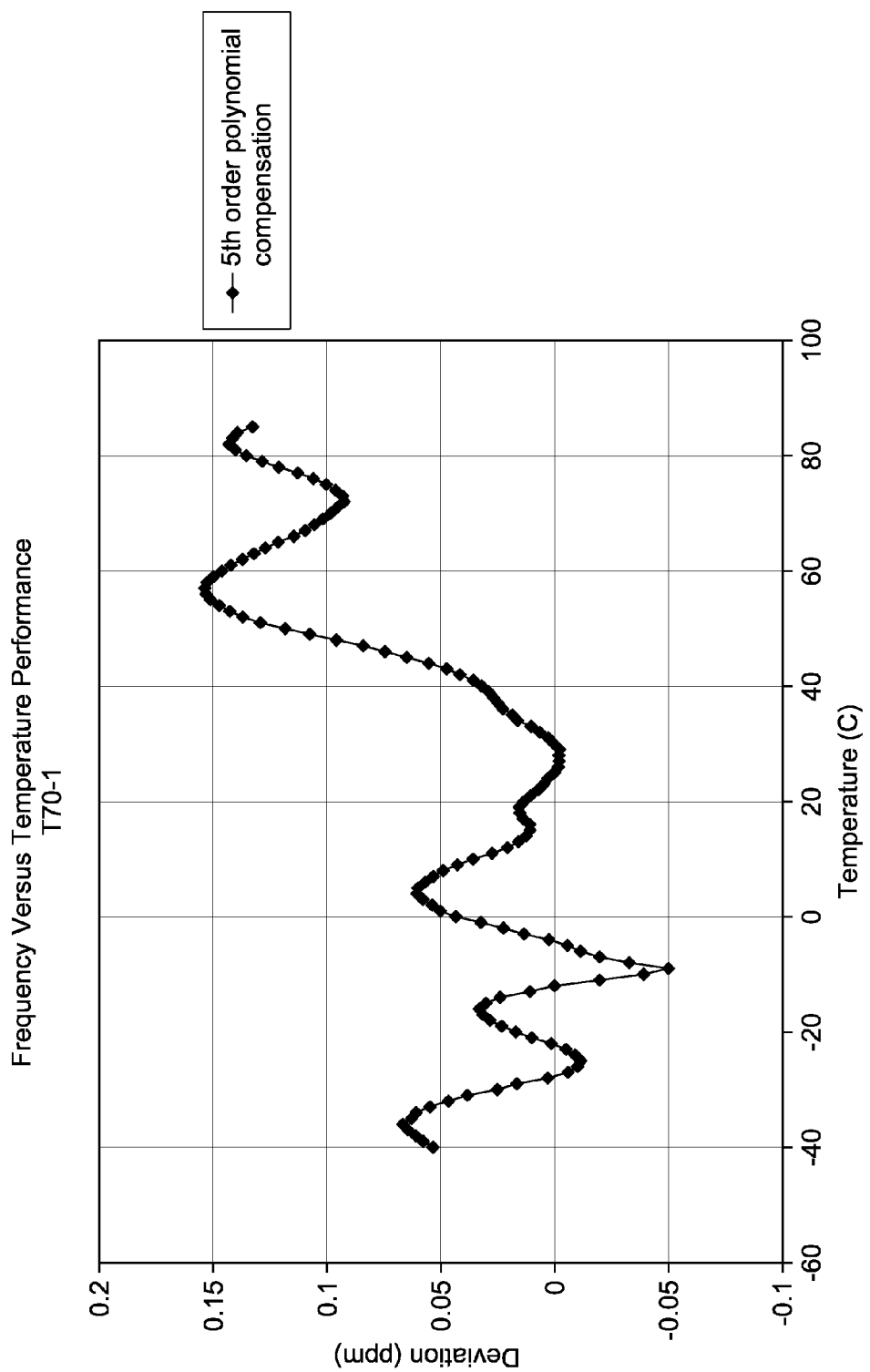
FIG. 20 is a graph showing data relating to performance of a $5^{th}$-order polynomial compensated oscillator.
Figure 21:
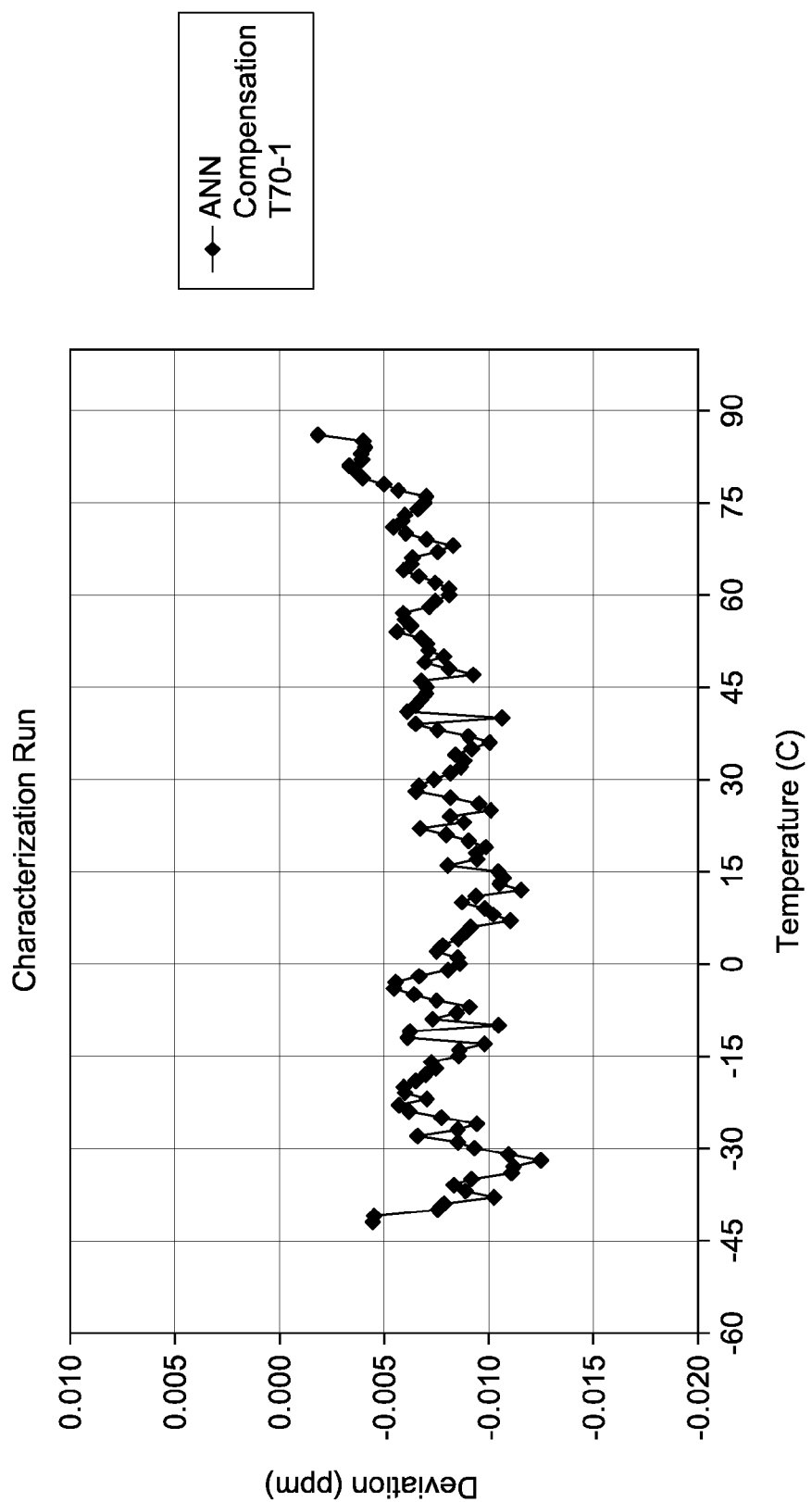
FIG. 21 is a graph showing data relating to performance of an embodiment of a neural network temperature-compensation frequency controller.

FIG. 20 below shows characterization data of the compensated oscillator prior to the ANN compensation being applied. In FIG. 20, the uncompensated oscillator may have a deviation over temperature of approximately +/−0.102 ppm. The data in FIG. 20 may correspond to the residual error from a $5^{th}$ order polynomial compensation scheme. This data, or similar data, may be used to train the ANN. FIG. 21 shows potential results after training the network and applying the compensation. Deviation after the ANN compensation is applied may be approximately +/−0.005 ppm. Such compensation may represent an improvement in performance of approximately 20 to 1, and may be accomplished using an ANN with approximately 33 neurons.

Figure 22:
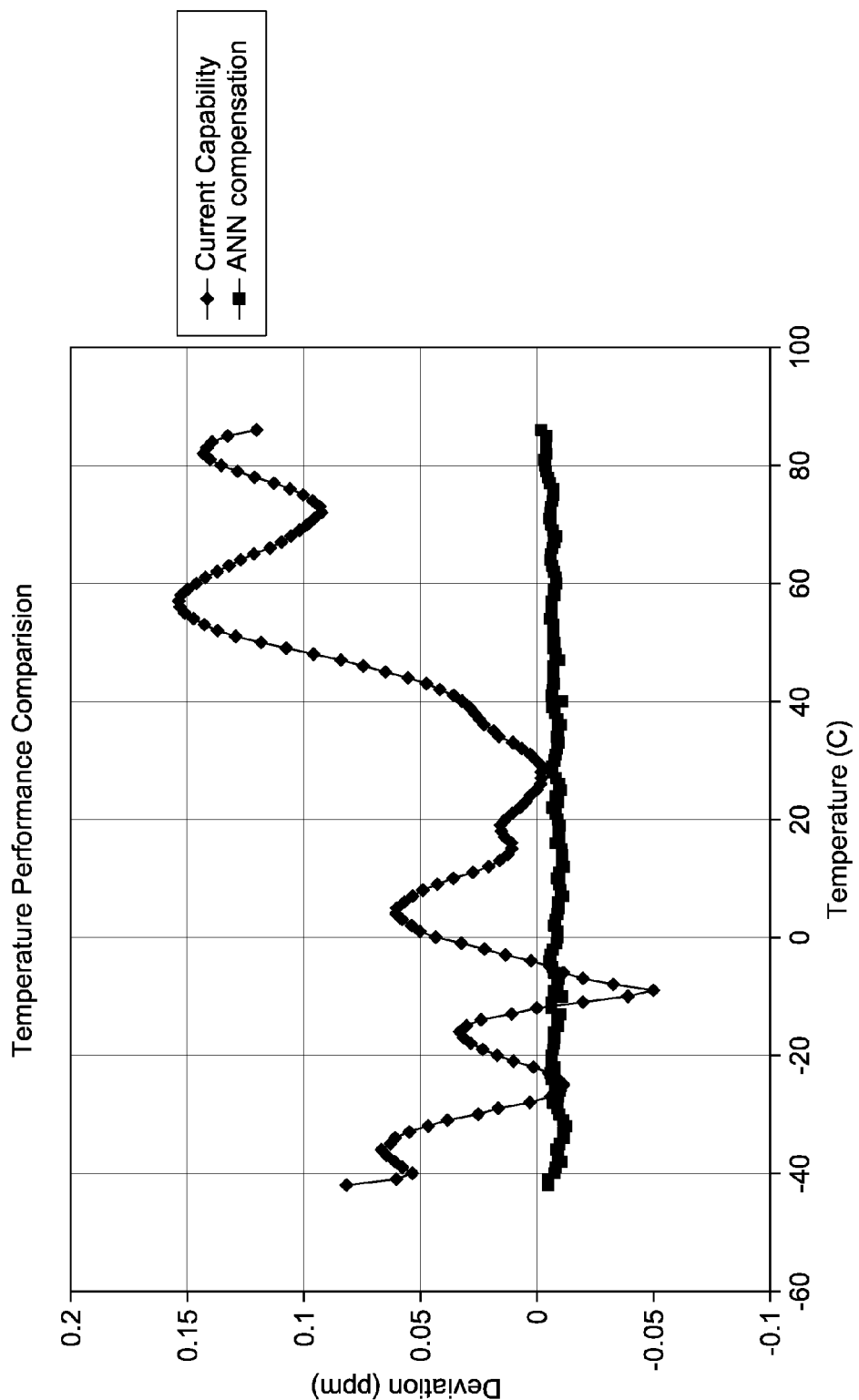
FIG. 22 is a graph showing data relating to two compensation systems.

These results may be considered encouraging in several ways. For example, as a primary compensation medium the ANN may provide a stability better than what is achievable with current state of the art TCXO's, such as about +/−0.1 ppm over the −42° C. to +86° C. temperature range. As a secondary compensation medium, with a starting condition of a compensated TCXO, an ANN may provide improved performance than can be achieved conventionally. Such a system may provide improvement as much as a 20 to 1, or more, which may rival OCXO's which are generally larger and have much larger power consumption. For comparison purposes, FIG. 22 shows a traditional $5^{th}$ order TCXO compensation and the ANN secondary compensation on the same plot and scale to provide a sense of potential improvement.

While the test results shown above are impressive with regard to an ANN compensation system's ability to reduce deviation in an oscillator, a system including temperature compensation may still experience various undesirable effects. For example, trim effect is a skewing of the frequency versus temperature performance as the control voltage (EFC) is adjusted by the user. As an electronic oscillator ages, its resonant frequency often changes. Adjusting the EFC may allow a user to restore the frequency output of the unit, but such adjustment may have a deleterious effect on temperature performance. This effect is often tolerated because there are currently few practiced solutions for this phenomenon.

Figure 23:
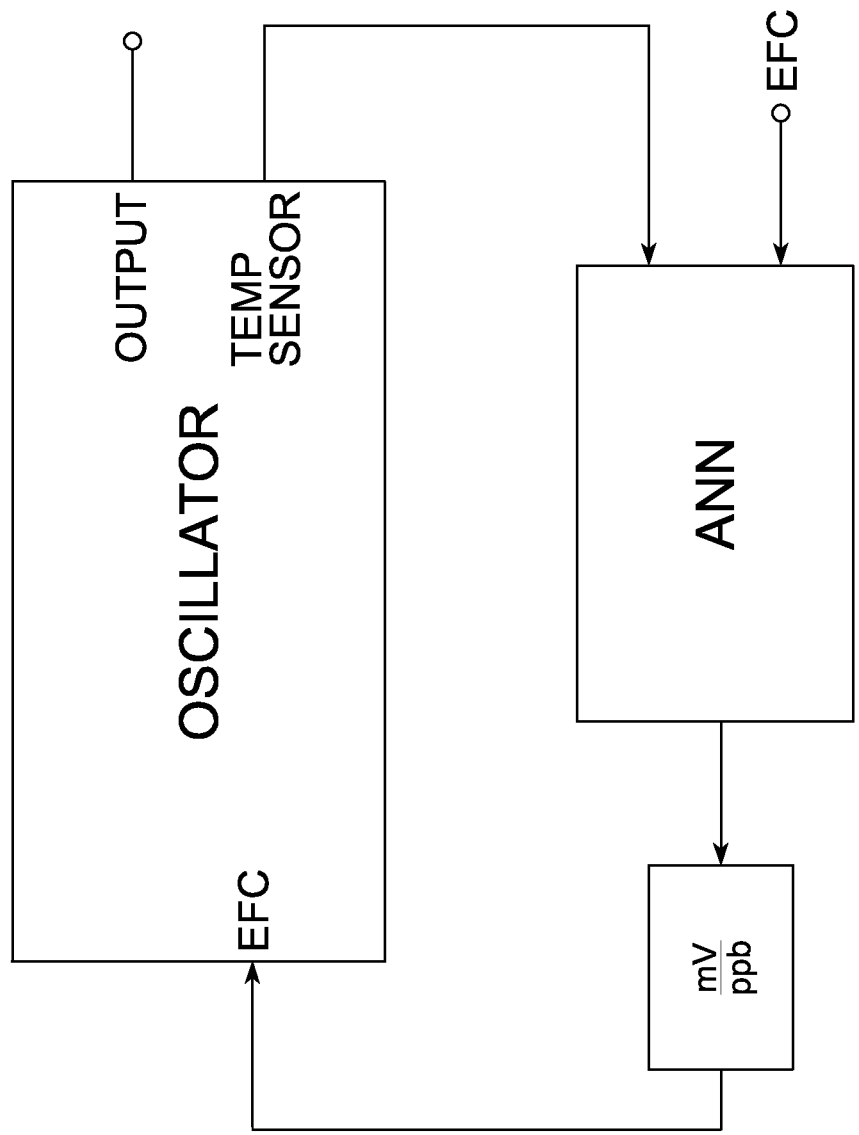
FIG. 23 is a block diagram of an embodiment of a neural network temperature and trim effect compensation system.
Figure 24:
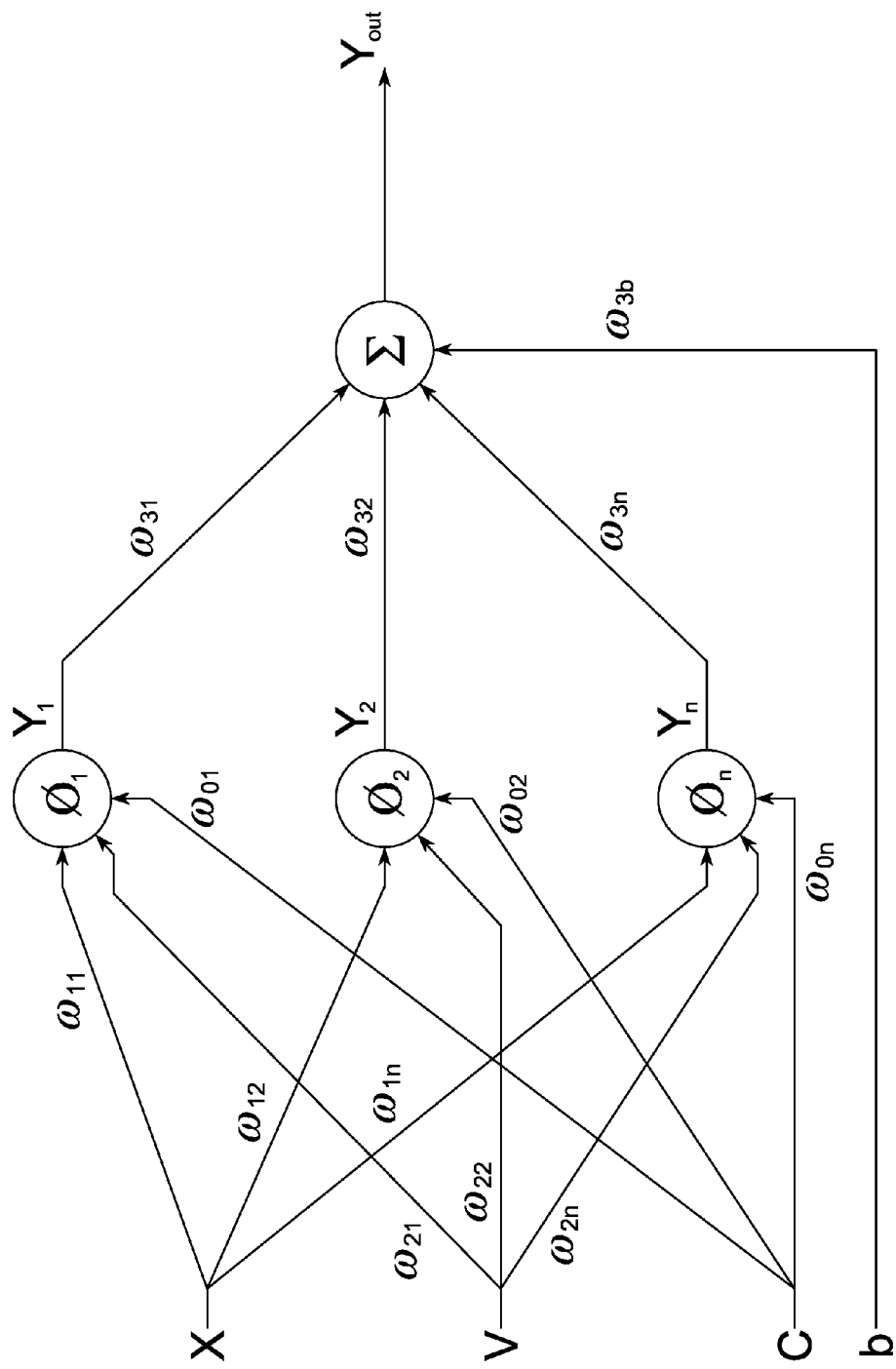
FIG. 24 is a schematic diagram of an embodiment of a neural network temperature and trim effect compensation system.

FIG. 23 provides a block diagram of an ANN system that compensates for trim effect as well as temperature, and FIG. 24 shows a schematic diagram of such an ANN system. In the embodiment of FIG. 23, a temperature sensor may reside inside the unit as near the resonator as possible to reduce temperature gradients between the sensor and the resonator. Inputs to the ANN may include the temperature sensor as well as a user-controlled EFC. The ANN may learn the oscillator's temperature and trim effect characteristics through a training process and allow a correction voltage to be created that is then fed into the control voltage input (EFC) pin of the oscillator. The correction voltage may move the frequency to the desired offset of the user and may compensate for undesirable trim effect.

In FIG. 24, 'X' represents the temperature sensor input, 'V' represents the EFC input, and b and C represents some constants which can be any real number. The respective weights may be actively solved for. In some embodiments, for ease of calculation, they may be set to 1. It is not necessary that the number of neurons be set to any particular number, and such number may be determined dependent on the complexity of the curve to be fitted. The formula for such an embodiment may be as follows, with 'n' representing the number of elements:

$$Y_n = \frac{1}{1 + e^{-a_n(\omega_{1n}x + \omega_{2n}v + \omega_{en}b)}} \quad (10)$$

$$Y_{OUT} = \omega_{31}Y_1 + \omega_{32}Y_2 + \ldots + \omega_{2n}Y_n + b\omega_{2b} \quad (11)$$

Figure 25:
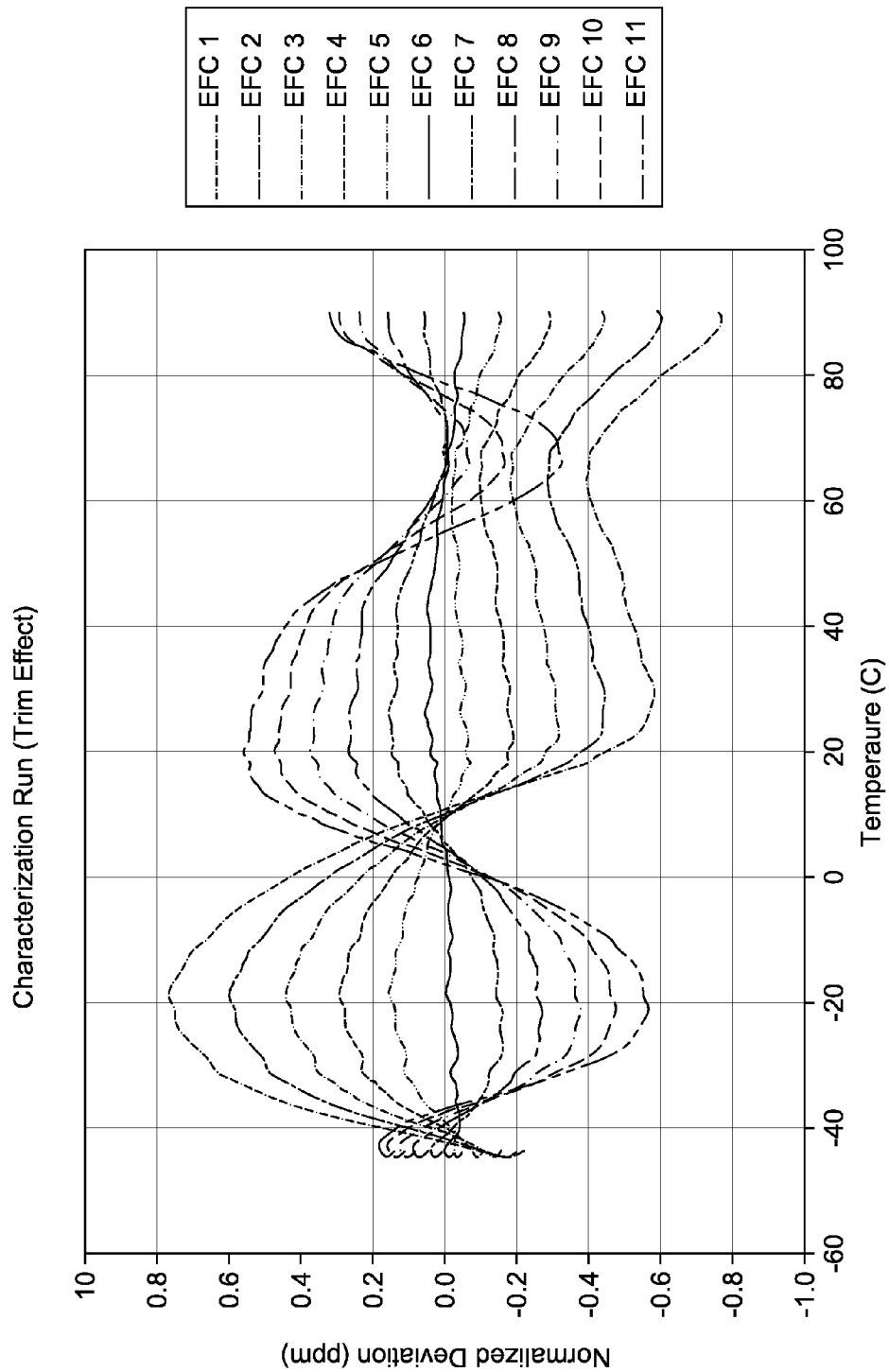
FIG. 25 is a graph showing information relating to trim effect of an electronic oscillator.
Figure 26:
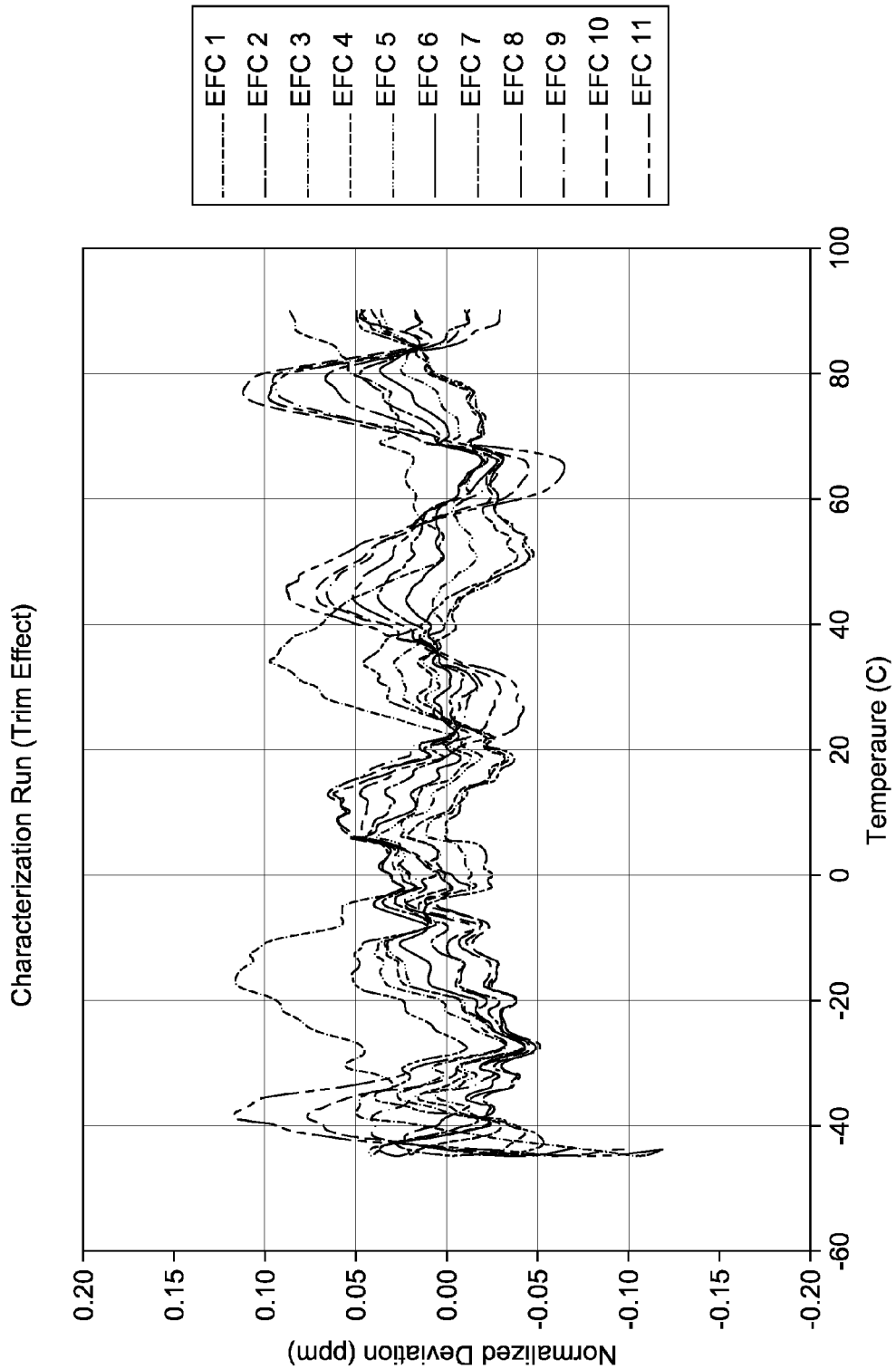
FIG. 26 is a graph showing information relating to performance of a neural network temperature and trim effect compensation system.

FIGS. 25 and 26 provide test results associated with a system constructed in accordance with FIGS. 23 and 24. FIG. 25 shows an ANN temperature-compensated crystal including deviation resulting trim effect. The trim effect has a total deviation of about 1.6 ppm in the results shown in FIG. 25.

FIG. 26 shows the resulting deviation after the ANN compensation circuit has been trained. In the system tested, the trim effect was compensated to a total deviation of about 0.25 ppm.

Figure 27:
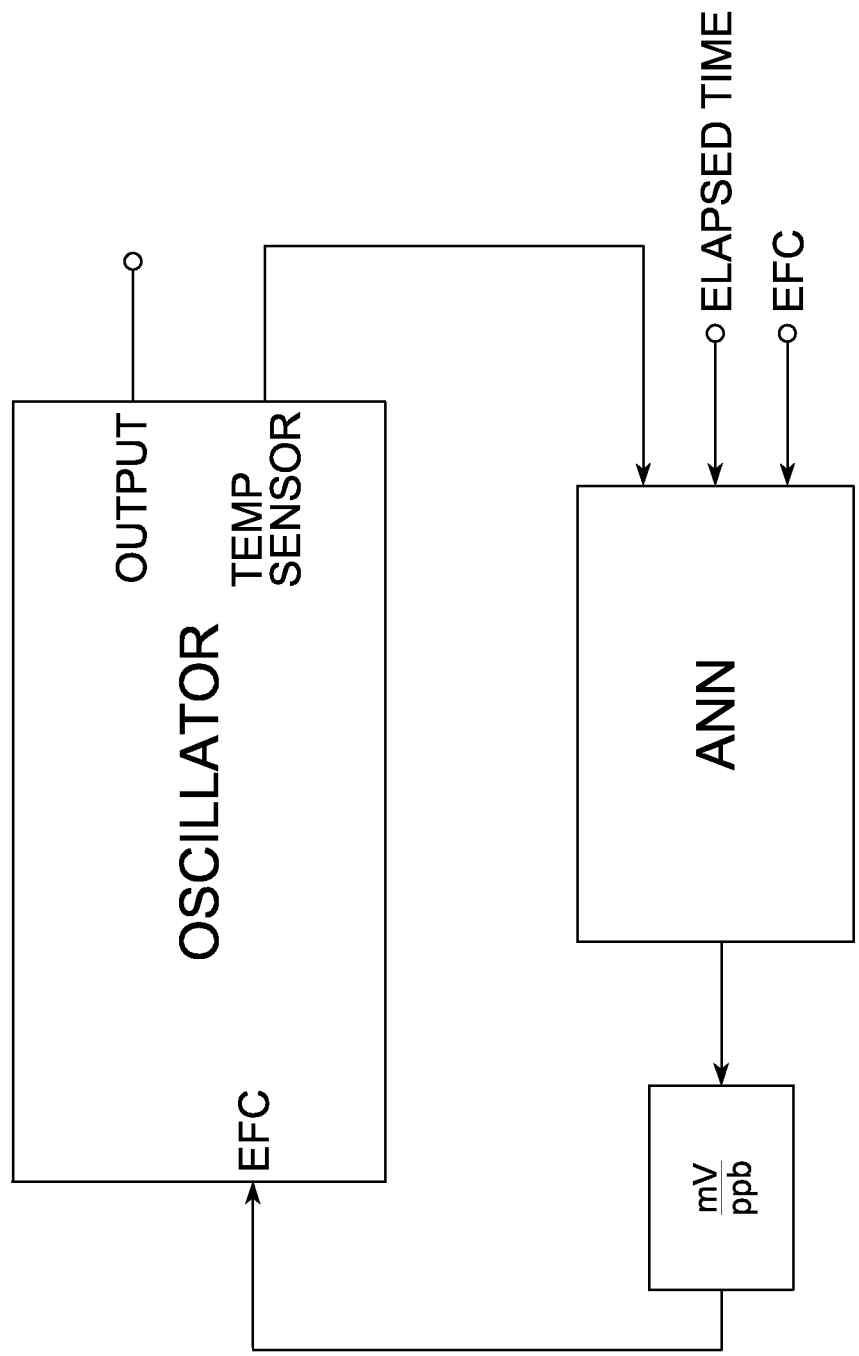
FIG. 27 is a block diagram of an embodiment of a neural network frequency-drift compensation system.
Figure 28:
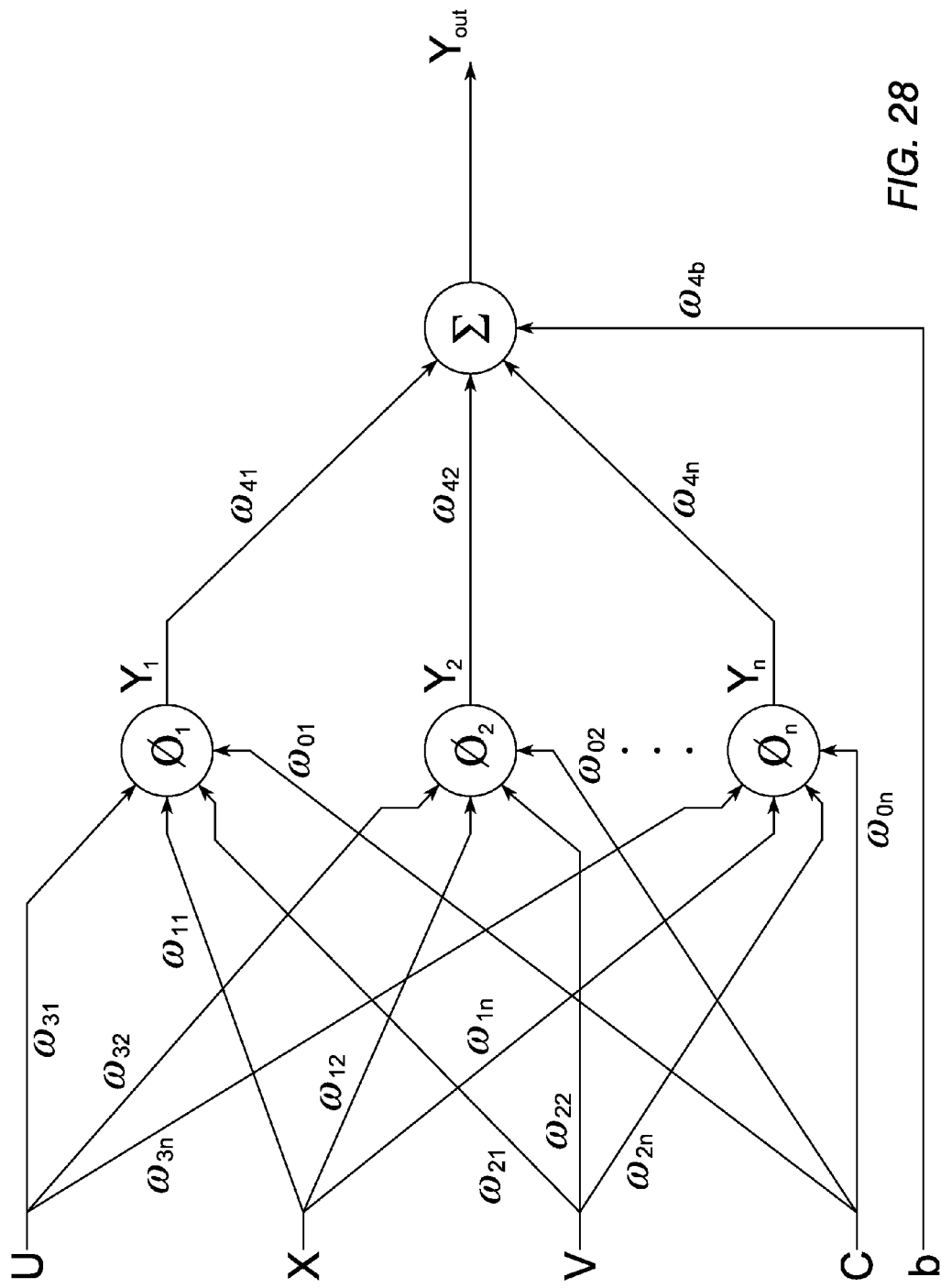
FIG. 28 is a schematic diagram of an embodiment of a neural network frequency-drift compensation system.

FIG. 27 depicts a block diagram representing a system that is configured to compensate for frequency drift during warm-up after power-up, as well as long-term aging, as the oscillator is powered up for a period of time. In some embodiments, the system includes three inputs. The third input may be elapsed time which may be needed to fit time-related frequency drift. An exemplary schematic for a three-input system is shown in FIG. 28.

Figure 29:
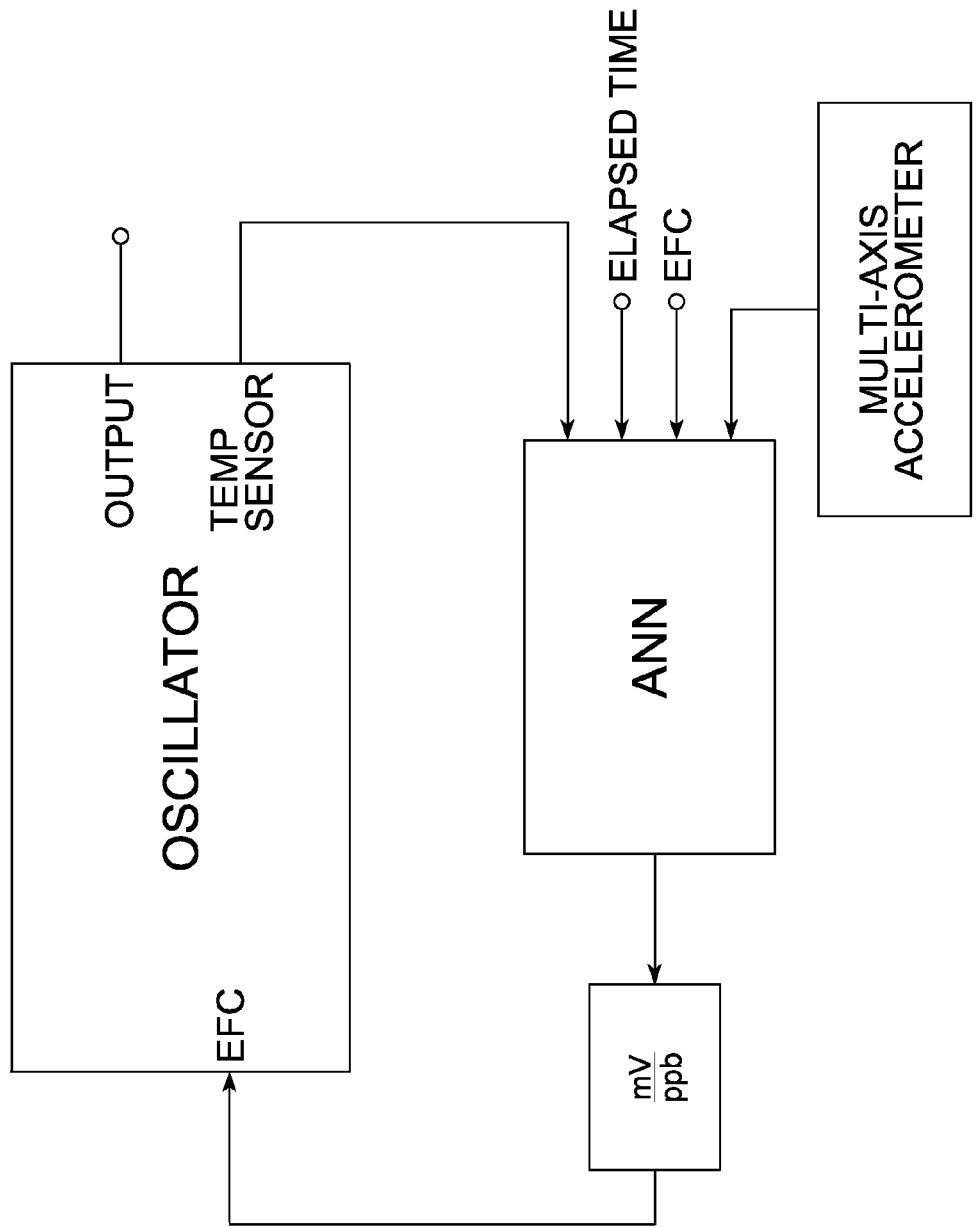
FIG. 29 is a block diagram of an embodiment of a neural network acceleration and vibration compensation system.

FIG. 29 illustrates an embodiment of a four-input network for compensating acceleration and vibration sensitivity. While the system of FIG. 29 compensates for both acceleration and vibration, systems may be configured to compensate for such parameters individually. In some embodiments, the fourth input is an accelerometer reading, such as a multi-axis accelerometer, which senses and inputs the acceleration and/or vibration the oscillator is feeling. The system may include inputs from any number of accelerometers.

Figure 30:
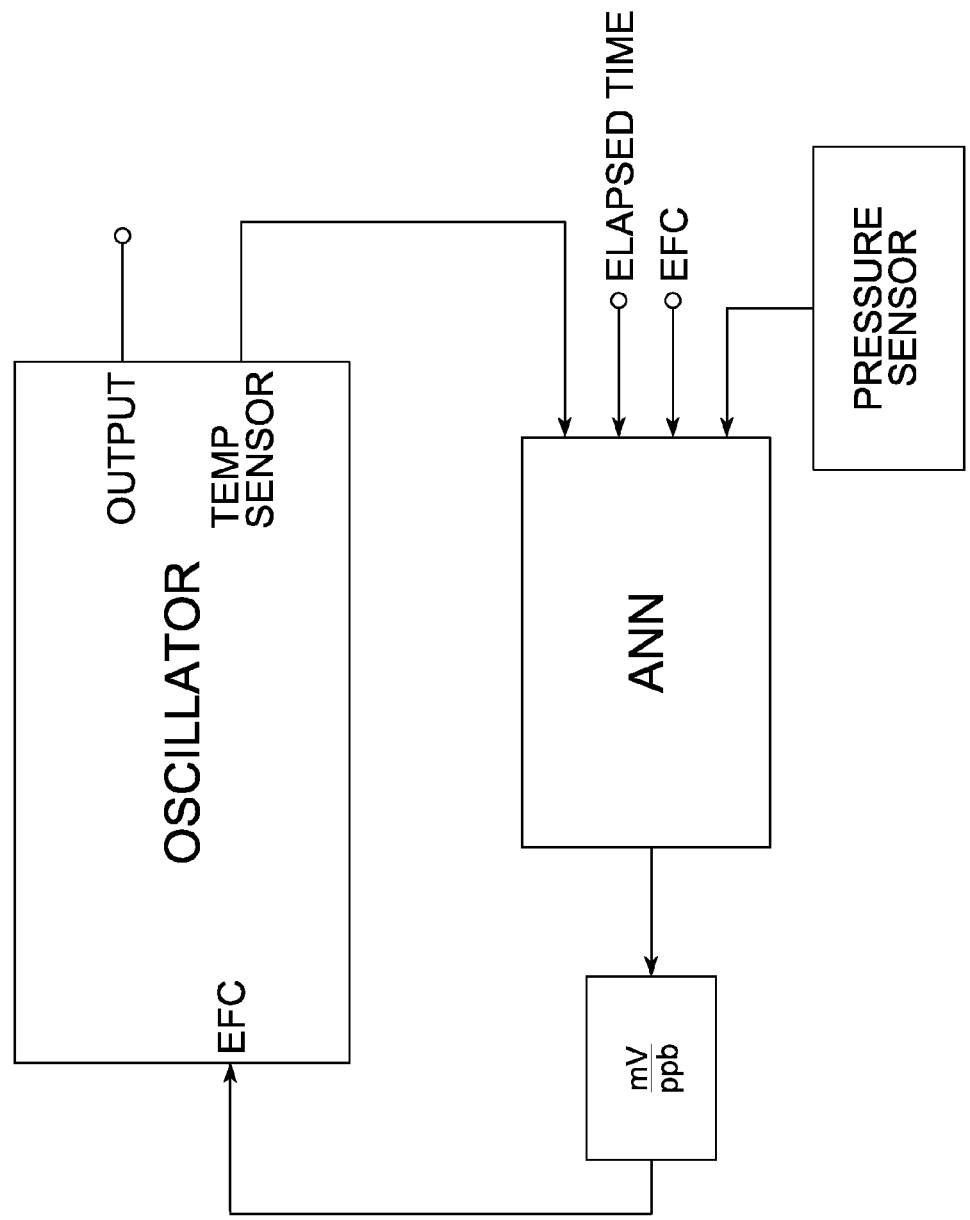
FIG. 30 is a block diagram of an embodiment of a neural network pressure compensation system.

FIG. 30 illustrates a block diagram of an embodiment of a four-input network that may compensate for pressure effects on an oscillator. Frequency change as a function of pressure may occur in applications at altitudes where air pressure changes induce a frequency shift. Such a frequency shift may be due to field changes from proximity effects of the housing deforming under differing pressures.

Figure 31:
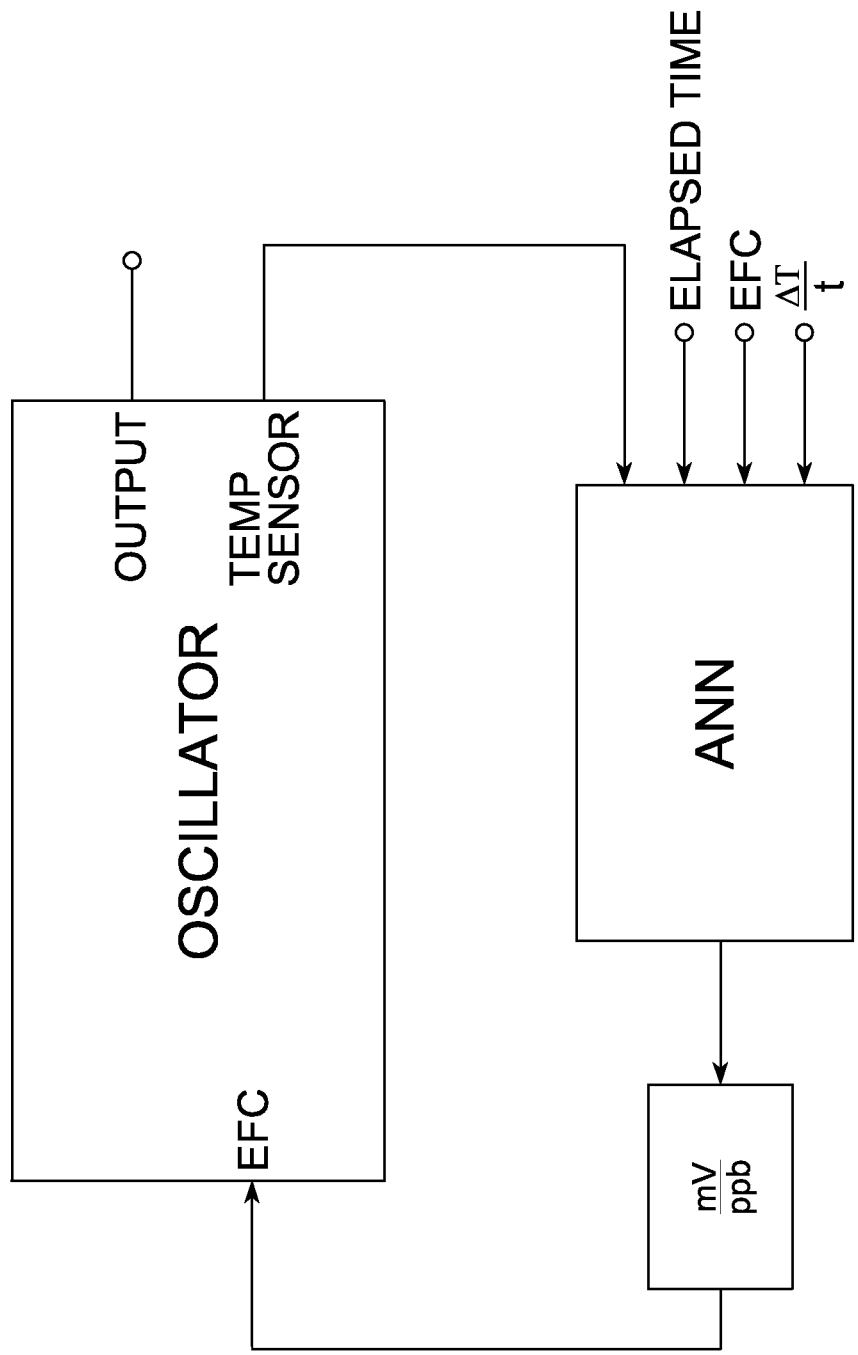
FIG. 31 is a block diagram of an embodiment of a neural network hysteresis compensation system.

FIG. 31 illustrates a block diagram of a four-input system that is configured to compensate for hysteresis effects. Hysteresis effects may be distortions of the frequency-versus-temperature curve that depend on the direction of change of temperature. For example, the frequency-versus-temperature curves may be different for an oscillator running hot to cold versus one running cold to hot. There also may be a time element to this effect—e.g., the slower the change, the less pronounced the effect may be; as a result, a change in temperature per time input may be needed to accurately describe the solution space.

In addition to the embodiments disclosed above, ANN architecture may be used as an oven controller. Such use may be suitable for oven-controlled crystal oscillator ("OCXO") and double oven OCXO ("DOCXO") applications. Block diagrams of these embodiments are shown below. Oven-controller applications may be implemented independently of, or in combination with, compensation networks, such as those described above.

Figure 32:
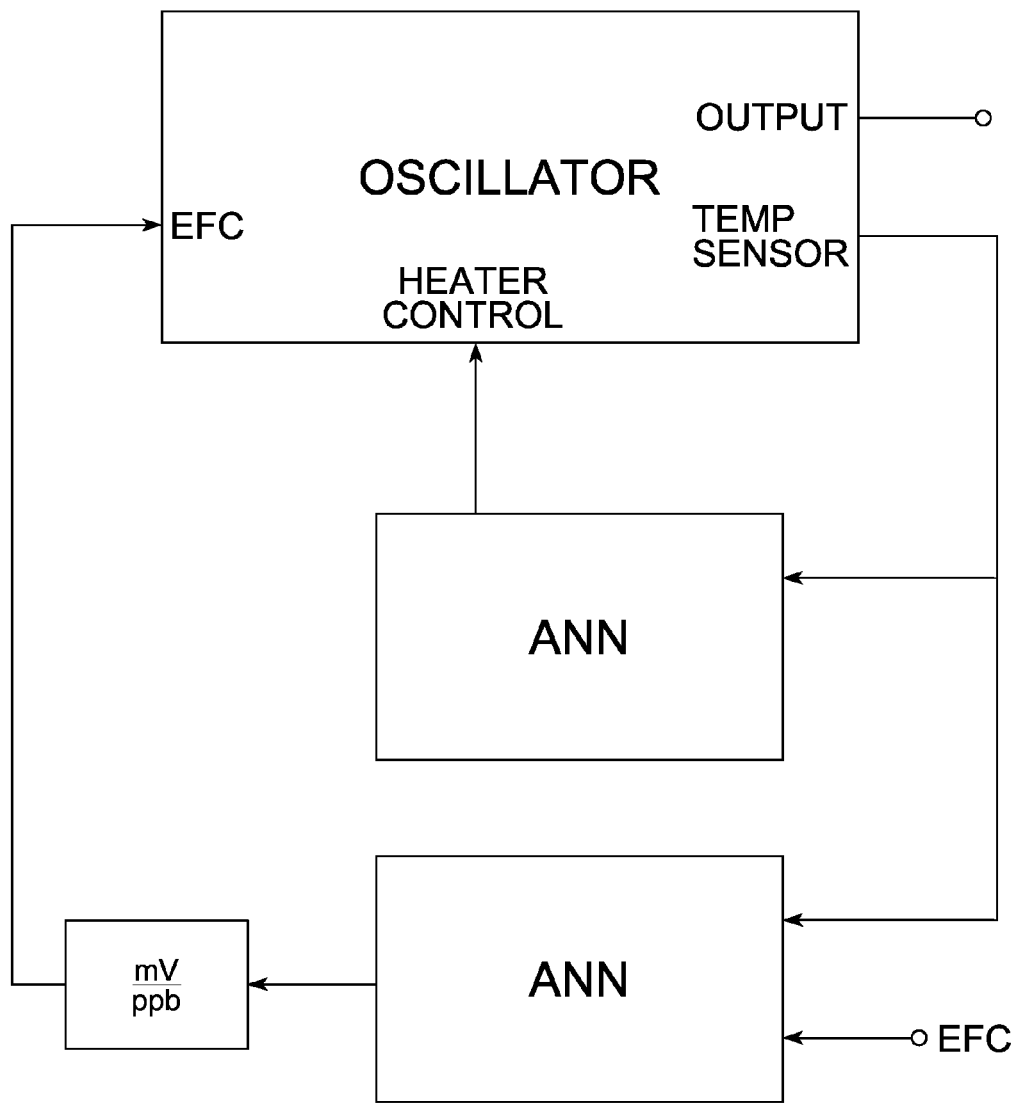
FIG. 32 is a block diagram of an embodiment of a neural network oven-controller system.
Figure 33:
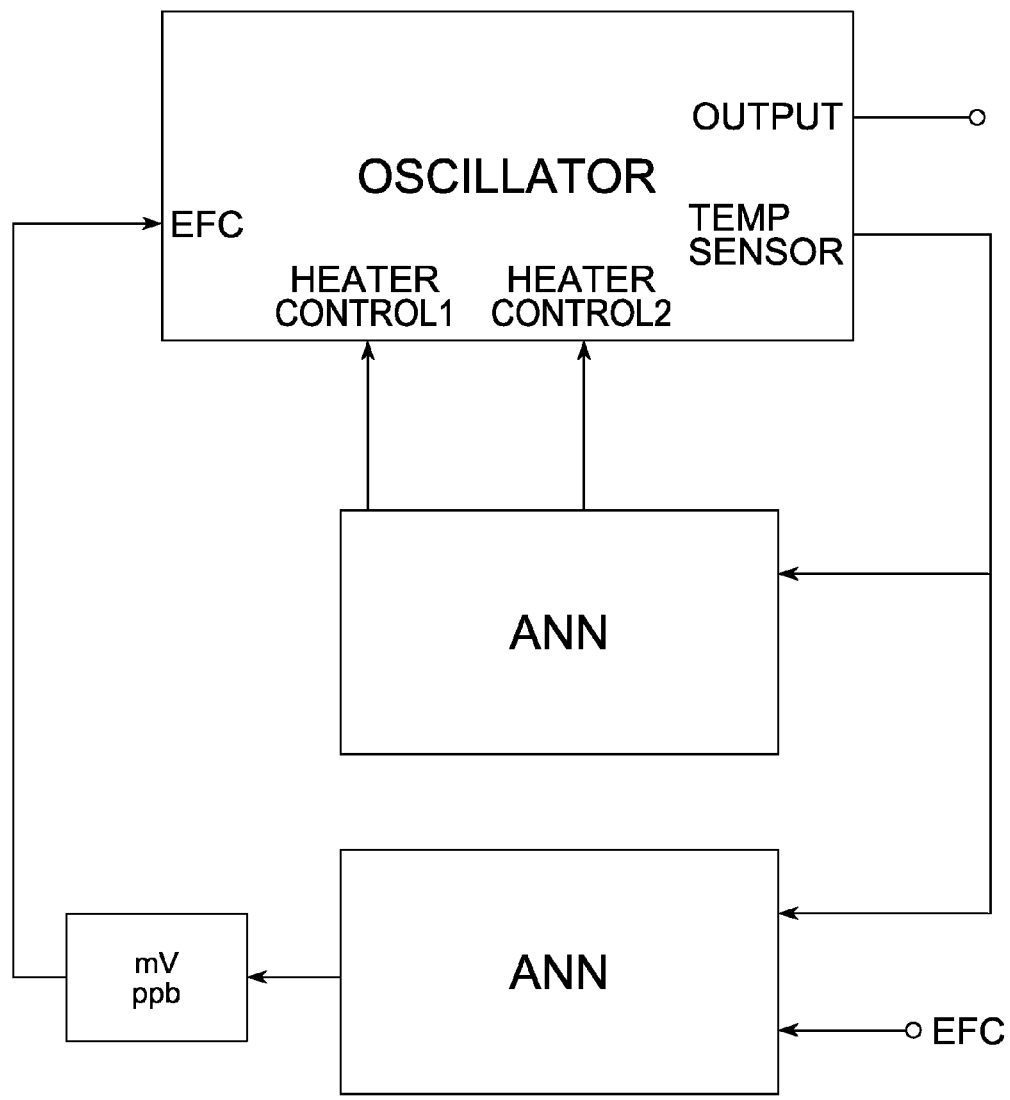
FIG. 33 is a block diagram of an embodiment of a neural network double-oven controller system.

FIG. 32 illustrates a block diagram of an embodiment of a system including an ANN oven-controller, as well as ANN temperature and trim effect compensation. FIG. 33 illustrates a block diagram of a double-oven controller. In some embodiments, an oven-controller system designed in accordance with embodiments disclosed herein provides double-oven performance with a single oven.

The systems tested, as described above, may be implemented using idealized software models. For example, an input may be converted from an analog voltage to a digital word, and the output converted back to an analog voltage. Furthermore, embodiments disclosed herein may be realized using hardware models as well. In some embodiments of hardware models, real world transistors and DAC POTS are used, which may allow for evaluation of resulting degradation of hardware components. In some embodiments, systems are implemented using an integrated model embodied in application-specific integrated circuit (ASIC).

The concepts disclosed herein have applicability in a broad range of systems and are not limited to the systems described above. For example, environmental effects measurable by an electrical sensor may be compensated in a manner similar to those discussed above. In some embodiments, additional features to be compensated require additional inputs to the network and, perhaps, more neurons because the solution space may become more complex with each additional feature.

Many other variations than those described herein may be apparent from this disclosure. For example, depending on the embodiment, certain acts, events, or functions of any of the algorithms described herein can be performed in a different sequence, can be added, merged, or left out all together (e.g., not all described acts or events are necessary for the practice of the algorithms). Moreover, in some embodiments, acts or events can be performed concurrently, e.g., through multi-threaded processing, interrupt processing, or multiple processors or processor cores or on other parallel architectures, rather than sequentially. In addition, different tasks or processes can be performed by different machines and/or computing systems that can function together.

The various illustrative logical blocks, modules, and algorithm steps described in connection with the embodiments disclosed herein can be implemented as electronic hardware, computer software, or combinations of both. To clearly illustrate this interchangeability of hardware and software, various illustrative components, blocks, modules, and steps have been described above generally in terms of their functionality. Whether such functionality is implemented as hardware or software depends upon the particular application and design constraints imposed on the overall system. The described functionality can be implemented in varying ways for each particular application, but such implementation decisions should not be interpreted as causing a departure from the scope of the disclosure.

The various illustrative logical blocks and modules described in connection with the embodiments disclosed herein can be implemented or performed by a machine, such as a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor can be a microprocessor, but in the alternative, the processor can be a controller, microcontroller, or state machine, combinations of the same, or the like. A processor can also be implemented as a combination of computing devices, e.g., a combination of a DSP and a microprocessor, a plurality of microprocessors, one or more microprocessors in conjunction with a DSP core, or any other such configuration. Although described herein primarily with respect to digital technology, a processor may also include primarily analog components. For example, any of the signal processing algorithms described herein may be implemented in analog circuitry. A computing environment can include any type of computer system, including, but not limited to, a computer system based on a microprocessor, a mainframe computer, a digital signal processor, a portable computing device, a personal organizer, a device controller, and a computational engine within an appliance, to name a few.

The steps of a method, process, or algorithm described in connection with the embodiments disclosed herein can be embodied directly in hardware, in a software module executed by a processor, or in a combination of the two. A software module can reside in RAM memory, flash memory, ROM memory, EPROM memory, EEPROM memory, registers, hard disk, a removable disk, a CD-ROM, or any other form of non-transitory computer-readable storage medium, media, or physical computer storage known in the art. An exemplary storage medium can be coupled to the processor such that the processor can read information from, and write information to, the storage medium. In the alternative, the storage medium can be integral to the processor. The processor and the storage medium can reside in an ASIC. The ASIC can reside in a user terminal. In the alternative, the processor and the storage medium can reside as discrete components in a user terminal.

While the above detailed description has shown, described, and pointed out novel features as applied to various embodiments, it will be understood that various omissions, substitutions, and changes in the form and details of the devices or algorithms illustrated can be made without departing from the spirit of the disclosure. As will be recognized, certain embodiments of the inventions described herein can be embodied within a form that does not provide all of the features and benefits set forth herein, as some features can be used or practiced separately from others.

What is claimed is:

1. A method of controlling frequency output of an electronic oscillator to compensate for effects of a parameter experienced by the oscillator, the method comprising:
   receiving test data from an electronic oscillator, the electronic oscillator being subject to a parameter, wherein the test data corresponds to outputs generated by the electronic oscillator while being subject to the parameter over a range of parameter values;
   calculating a plurality of weights based at least in part on the test data;
   receiving from the electronic oscillator one or more input signals corresponding to a current value of the parameter;
   providing the one or more input signals to a neural network processing module including one or more processors;
   providing the plurality of weights to the neural network processing module;
   using the neural network processing module to calculate a neural network output signal based at least in part on the one or more input signals and the plurality of weights;
   determining a correction voltage based at least in part on the neural network output signal; and
   providing the correction voltage to the electronic oscillator, thereby at least partially controlling the frequency of the electronic oscillator.

2. The method of claim 1, wherein said calculating the plurality of weights is performed prior to said receiving the one or more input signals.

3. The method of claim 1, further comprising generating an intelligent seed value, wherein calculating the plurality of weights is based at least in part on the intelligent seed value.

4. The method of claim 1, wherein calculating the neural network output signal comprises:
   providing the one or more input signals and the plurality of weights to a plurality of artificial neuron modules of the neural network processing module, wherein at least one of the plurality of weights is provided to each of the plurality of artificial neuron modules; and
   providing a neuron output from each of the plurality of neuron modules to a linear summer module, wherein the neural network output signal is based at least in part on an output of the linear summer module.

5. The method of claim 4, further comprising providing a bias input to the linear summer for shifting the output of the linear summer up or down.

6. The method of claim 4, wherein each of the plurality of artificial neuron modules utilizes at least one of the plurality of weights and each of the one or more input signals as variables of a non-linear activation function, wherein each of the plurality of artificial neuron modules provides an output that is based at least in part on a solution of the non-linear activation function.

7. The method of claim 6, wherein the non-linear activation function is continuous and differentiable.

8. The method of claim 6, wherein the non-linear activation function is a sigmoid function.

9. A system for controlling frequency output of an electronic oscillator, the system comprising:
   a first input signal corresponding to a first parameter of an electronic oscillator; and
   a neural network processing module operatively coupled to the first input signal, the neural network processing module comprising a plurality of artificial neuron modules, wherein each of the plurality of artificial neuron modules receives the first input signal and one of one or more pre-calculated weights, and provides a first output signal based at least in part on the first input signal and the one of the one or more pre-calculated weights;
   wherein the one or more pre-calculated weights are derived at least in part from test data that corresponds to outputs generated by the electronic oscillator while experiencing a range of values of the first parameter;
   wherein the neural network processing module is configured to provide a second output signal to the electronic oscillator to thereby at least partially control frequency output of the electronic oscillator.

10. The system of claim 9, wherein the second output is not based on a real-time oscillating signal output of the electronic oscillator.

11. The system of claim 9, wherein the parameter is related to a temperature of at least a portion of the electronic oscillator.

12. The system of claim 9, further comprising a second input signal corresponding to a second parameter, wherein each of the plurality of artificial neuron modules receives the second input signal, the first output signal being based in part on the second input signal.

13. The system of claim 12, further comprising a third input signal corresponding to a third parameter, wherein each of the plurality of artificial neuron modules receives the third input signal, the first output signal being based in part on the third input signal.

14. The system of claim 9, wherein the neural network processing module generates the second output signal and provides the second output signal to a voltage conversion module configured to convert the second output signal into a correction voltage, and provide the correction voltage to the electronic oscillator.

15. A system for providing a correction signal to at least partially compensate for effects of a parameter of an electronic device, the system comprising:

a first neural network processing module comprising one or more processors and configured to receive a first input signal corresponding to a parameter, the parameter corresponding to hysteresis effects experienced by an electronic oscillator;

wherein the first neural network processing module comprises a plurality of artificial neuron modules, wherein each of the plurality of artificial neuron modules receives one of one or more pre-calculated weights, and wherein the first neural network processing module is configured to provide a correction signal based at least in part on the first input signal and the one or more pre-calculated weights.

16. The system of claim 15, wherein the neural network processing module is configured to provide the correction signal to the electronic oscillator, and the parameter is associated with the electronic oscillator.

17. The system of claim 16, wherein the first input signal corresponds to a temperature of at least a portion of the electronic oscillator.

18. The system of claim 17, wherein the neural network processing module is further configured to receive a second input signal, the second input signal relating to an age of the electronic oscillator.

19. The system of claim 15 further comprising a memory module, an analog-to-digital converter, a digital-to-analog converter, and a low-pass filter.

20. The system of claim 15, wherein the first input signal is provided by a motion sensor.

21. The system of claim 20, wherein the motion sensor is an accelerometer.

22. The system of claim 15, wherein the first input signal is provided by a pressure sensor.

23. The system of claim 15, further comprising a second neural network processing module configured to receive the first input signal and provide a second output signal.

24. The system of claim 23, wherein the second output signal is configured to at least partially control a heater device associated with the electronic oscillator.

* * * * *